(12) United States Patent
Puzella et al.

(10) Patent No.: US 12,507,347 B2
(45) Date of Patent: Dec. 23, 2025

(54) RF COVER LAYER

(71) Applicant: Raytheon Company, Waltham, MA (US)

(72) Inventors: Angelo M. Puzella, Marlborough, MA (US); Philip M. Henault, Medway, MA (US); Alexander B. Brailovsky, Irvine, CA (US)

(73) Assignee: Raytheon Company, Arlington, VA (US)

( * ) Notice: Subject to any disclaimer, the term of this patent is extended or adjusted under 35 U.S.C. 154(b) by 286 days.

(21) Appl. No.: 18/471,385

(22) Filed: Sep. 21, 2023

(65) Prior Publication Data
US 2025/0107006 A1  Mar. 27, 2025

(51) Int. Cl.
| | |
|---|---|
| H05K 3/00 | (2006.01) |
| H01Q 9/04 | (2006.01) |
| H05K 1/02 | (2006.01) |
| H05K 3/24 | (2006.01) |

(52) U.S. Cl.
CPC ......... *H05K 3/0079* (2013.01); *H01Q 9/0414* (2013.01); *H05K 1/024* (2013.01); *H05K 1/0242* (2013.01); *H05K 3/244* (2013.01); *H05K 2201/10098* (2013.01); *H05K 2203/0557* (2013.01)

(58) Field of Classification Search
CPC ....... H05K 1/024; H05K 1/0242; H05K 3/244
See application file for complete search history.

(56) References Cited

U.S. PATENT DOCUMENTS

| | | |
|---|---|---|
| 5,700,607 A | 12/1997 | Rath et al. |
| 10,777,900 B2 | 9/2020 | Tankielun et al. |
| 11,336,167 B1 | 5/2022 | Vinciarelli et al. |

(Continued)

FOREIGN PATENT DOCUMENTS

| | | |
|---|---|---|
| DE | 3632128 A1 | 4/1988 |
| JP | H08-181458 A | 7/1996 |

OTHER PUBLICATIONS

International Search Report and Written Opinion of the International Searching Authority dated Oct. 30, 2024 in connection with International Patent Application No. PCT/US2024/035417, 11 pages.

(Continued)

*Primary Examiner* — Daniel McNally

(57) ABSTRACT

A printed circuit board comprises a support structure, a conductive layer operably coupled to the support structure, a mask structure formed on the conductive layer, and a cover layer. The conductive layer comprises first and second portions of conductive material separated by a gap that defines a spacing between the first and second portions that does not contain conductive material. The mask structure defines first and second regions on the conductive layer. The first region is enclosed by a first boundary defined by the mask structure and includes the gap. The second region lies outside of the first boundary. The cover layer is sized to fit within the first region and comprises a laminatible insulating material that flows within the first region during lamination. During lamination, the first boundary prevents the laminatible insulating material from flowing into the second region, and the laminatible insulating material flows to fill the gap.

20 Claims, 16 Drawing Sheets

(56) References Cited

U.S. PATENT DOCUMENTS

| | | |
|---|---|---|
| 11,705,641 B2 | 7/2023 | Kim et al. |
| 2002/0162685 A1 | 11/2002 | Gotro et al. |
| 2004/0085149 A1* | 5/2004 | Shimada .............. H05K 1/0228 |
| | | 333/4 |
| 2004/0091622 A1 | 5/2004 | Fernandes et al. |
| 2006/0055501 A1 | 3/2006 | Burke et al. |
| 2006/0152329 A1 | 7/2006 | Bjorsell |
| 2007/0010065 A1 | 1/2007 | Das et al. |
| 2010/0109052 A1 | 5/2010 | Nakajima et al. |
| 2010/0201579 A1 | 8/2010 | Das |
| 2010/0295646 A1 | 11/2010 | Harrison et al. |
| 2015/0255418 A1 | 9/2015 | Gowda et al. |
| 2015/0340569 A1 | 11/2015 | Tamaki et al. |
| 2017/0271734 A1 | 9/2017 | Yu et al. |
| 2019/0013288 A1 | 1/2019 | Kim et al. |
| 2020/0412021 A1 | 12/2020 | Chang et al. |
| 2021/0127490 A1 | 4/2021 | Palm et al. |
| 2021/0143539 A1 | 5/2021 | Yuan et al. |
| 2021/0301133 A1 | 9/2021 | Mizori |
| 2021/0313478 A1 | 10/2021 | Maimon et al. |
| 2022/0045014 A1 | 2/2022 | Chen et al. |
| 2022/0102263 A1 | 3/2022 | Ng et al. |
| 2022/0199315 A1 | 6/2022 | Jung et al. |

OTHER PUBLICATIONS

Isola, "PCB Material Selection for RF, Microwave and Millimeter-wave Design;" PowerPoint Presentation; Nov. 26, 2016; Part 1 of 2; 30 Pages.

Isola, "PCB Material Selection for RF, Microwave and Millimeter-wave Design;" PowerPoint Presentation; Nov. 26, 2016; Part 2 of 2; 31 Pages.

Priday et al., "Designing Microwave PCBs for Successful Manufacture—Getting it Right the First Time;" from *Microwave Journal*; Teledyne Defense Electronics Company; Jul. 15, 2019; 18 Pages.

Sierra Circuits, "PCB Manufacturing;" Retrieved from https://www.protoexpress.com/ on Aug. 8, 2023; Part 1 of 2; 13 Pages.

Sierra Circuits, "PCB Manufacturing;" Retrieved from https://www.protoexpress.com/ on Aug. 8, 2023; Part 2 of 2; 13 Pages.

The Tech Zone, "Surface Finishes;" PowerPoint Presentation; PCB Solutions; Jan. 2009; 10 Pages.

\* cited by examiner

RF COVER LAYER

FIELD

Embodiments of the disclosure generally relate to devices, systems, and methods for making printed wiring boards and circuitry usable transmitting and receiving electromagnetic waves at radio frequencies (RF) and microwave frequencies. More particularly, the disclosure describes embodiments relating to devices, systems, and methods for improving RF and/or microwave performance of RF and microwave circuits via use of an RF cover layer on RF and microwave circuit assemblies.

BACKGROUND

Printed wiring boards (PWBs), also known in the art as printed circuit boards (PCBs) provide a structure giving mechanical support to circuit components and have built into them one or more conductive electrical connections (such as pads, traces, via holes, etc.) between circuit components. Many PWBs are multi-layer PWBs that are formed from multiple layers of substrates laminated together, including conductive and non-conductive substrates, which are interconnected with the via holes. The conductive electrical connections may be formed by etching a sheet of conductive material (e.g., copper) that has been laminated onto a substrate made of a non-conductive material. The conductive electrical connections and other conductive features are etched from the sheet of conductive material. Additional layers, such as surface finish, solder mask, silk-screening, etc., may be applied as well.

For example, FIG. 1 is a portion of a cross section of an exemplary prior art first PWB 10 made of several layers of materials, including a dielectric core 302, an outer portion of a conductive layer, such as a copper layer 304, a layer of surface finish 306 (in this exemplary prior art first PWB 10, the layer of surface finish 306 is a conductive surface layer such as an ENIG plating, (e.g., electroless nickel layer 310 and immersion gold layer 308), with a solder mask base 504 (base layer of solder mask) on top of the copper layer 304, a layer of surface finish 306 on top of the copper 304, and a silkscreen 505 of print/ink (e.g., part number, code, etc.) on top of the solder mask base 504.

SUMMARY

The following presents a simplified summary to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

PWBs like those of FIG. 1 are used in many applications, including applications that involve high frequency, e.g., radio frequency (RF) and above, such as communications circuits, radar circuits (including but not limited to military/defense radar circuits, multiple input multiple output (MIMO) radar circuits, air-traffic control radar circuits, weather radar circuits, and/or automotive radar circuits), satellite communication antenna arrays, cellular/mobile communications circuits (e.g., 5G wireless communications arrays and circuits), and many other applications. However, configurations of a PWB that may have acceptable performance at lower frequencies, can have several types of performance problems when used with higher frequency types of circuits.

For example, many PWBs have a surface finish that covers an outer layer of bare copper, where the surface finish is a plating made from a material such as ENIG (Electroless Nickel Immersion Gold). As is known, surface finish materials can correspond to a type of joint material capable of allowing two metallic components or features to be joined together. The surface finish has two main functions: preventing the copper from oxidizing and providing a solderable, or wire-bondable, surface. ENIG is a two-layer metallic coating of 0.04-0.1 µm of gold (Au) over 2-6 µm of nickel (Ni). For example, in some ENIG coatings, the plating thickness of the nickel is greater than ten times the plating thickness of the gold. In some arrangements, the nickel serves as a protective barrier to the copper and is the surface to which the components are actually soldered. The gold protects the nickel during storage and also provides the low contact resistance required for the thin gold deposits. In some arrangements, the ENIG surface finish provides a thin, gold, solderable layer that protects the copper traces on a PWB with a nickel barrier between it and the copper.

ENIG can be advantageous for PWBs that are used with complex components where flat surfaces are essential, such as flip chips and ball grid arrays (BGAs). In addition, in some arrangements, the ENIG surface finishes can be required, for example, for areas of the PWB that have surface-mount component solder re-flow assembly and/or signal pad wire bonding. Although various types of surface finishes are available, ENIG surface finish is amongst the most popular and most widely used in the PWG industry (as of this writing, ENIG is used in approximately 80% of PWBs) because ENIG is fast and easy to apply, is lead free, is long lasting and durable, is compliant with RoHS (Restriction of Hazardous Substances), has very good solderability, and is relatively low-cost.

Despite the usefulness of ENIG as a surface finish, ENIG can have disadvantages in some applications, such as those involving higher frequencies (e.g., radio frequencies and above). In particular, at higher frequencies, PWBs having an ENIG surface finish can be subject to significant losses at RF that increase as frequency increases. In addition, when there is a high level of RF power, there can be an RF breakdown inside electrically small gaps in RF circuits, and ENIG provides no protection or mitigation for this issue.

At least some embodiments herein help to address at least some of these challenges.

In one aspect, a printed circuit board is provided, comprising a support structure, a conductive layer, a mask structure, and a cover layer. The conductive layer is operably coupled to the support structure, the conductive layer comprising a first portion of conductive material and a second portion of conductive material separated by a gap that defines a spacing between the first portion of conductive material and the second portion of conductive material, wherein the gap does not contain conductive material. The mask structure is formed on the conductive layer, the mask structure defining at least a first region on the conductive layer and a second region on the conductive layer, wherein the first region is enclosed by a first boundary defined by the mask structure and wherein the second region lies outside of the first boundary, wherein the first region includes the gap. The cover layer is sized to fit within the first region, wherein the cover layer comprises a laminatible insulating material configured to flow within the first region during a lamination process, wherein the first boundary is configured to prevent the laminatible insulating material from flowing into the second region, and wherein the laminatible insulating material is configured to flow to fill at least a portion of the gap during the lamination process.

In some embodiments, the mask structure comprises solder mask material. In some embodiments, the mask structure comprises: a base layer formed on the conductive layer; and a dam layer formed on the base layer; wherein the base layer corresponds to a solder mask applied to the printed circuit board. In some embodiments, the cover layer comprises prepreg material.

In some embodiments, the printed circuit board further comprises a conductive surface finish layer formed on the second region of the conductive layer, wherein the conductive surface finish layer is configured to protect the conductive layer. In some embodiments, the mask structure is configured to serve as a mask during an application of the conductive surface finish layer, wherein the mask structure is configured to limit the application of the conductive surface finish layer to the second region and to prevent application of the conductive surface finish layer in the first region. In some embodiments, the conductive surface finish layer comprises an electroless nickel layer and an immersion gold layer.

In some embodiments, the cover layer is sized to ensure that, after the lamination process, the laminatible insulating material is sealed to the mask structure along at least a portion of the first boundary. In some embodiments, at least one of the first portion of the conductive layer and the second portion of the conductive layer comprises an element of a radio frequency (RF) circuit. In some embodiments, after the lamination process, at least a portion of the laminatible insulating material fills at least a portion of the gap and is configured to minimize arcing between the first portion of the conductive layer and the second portion of the conductive layer. In some embodiments, the conductive layer comprises a radiator circuit.

In a further aspect, a method of making a printed circuit board is provided. A support structure is provided. A conductive layer is applied to the support structure, the conductive layer comprising a first portion of conductive material and a second portion of conductive material separated by a gap that defines a spacing between the first portion of conductive material and the second portion of conductive material, wherein the gap does not contain conductive material. A mask structure is formed on the conductive layer, the mask structure defining at least a first region on the conductive layer and a second region on the conductive layer, wherein the first region is enclosed by a first boundary defined by the mask structure and wherein the second region lies outside of the first boundary, wherein the first region includes the gap. A cover layer sized to fit within the first region, is coupled to the first region, wherein the cover layer comprises a laminatible insulating material configured to flow within the first region during a lamination process, wherein the first boundary is configured to prevent the laminatible insulating material from flowing into the second region, and wherein the laminatible insulating material is configured to flow to fill at least a portion of the gap during the lamination process, wherein a combination of the support structure, conductive layer, mask structure, and cover layer define a printed circuit board assembly. The printed circuit board assembly is laminated.

In some embodiments, the laminating is configured to ensure that laminatible insulating material is sealed to the mask structure along at least a portion of the first boundary.

In some embodiments, the laminating is configured to ensure that at least a portion of the laminatible insulating material fills at least a portion of the gap and is configured to minimize arcing between the first portion of the conductive layer and the second portion of the conductive layer.

In some embodiments, the method further comprises applying a conductive surface finish layer to the second region of the conductive layer, wherein the conductive surface finish layer is configured to protect the conductive layer. In some embodiments, the mask structure is configured to serve as a mask during the applying of the conductive surface finish layer, wherein the mask structure is configured to limit the applying of the conductive surface finish layer to the second region and to prevent applying of the conductive surface finish layer in the first region.

In another aspect, a printed circuit board is provided, comprising a support structure, a conductive RF circuit layer, a mask structure, and a cover layer. The conductive RF circuit layer is operably coupled to the support structure, the conductive RF circuit layer comprising a first RF circuit formed using a first portion of conductive material and a second RF circuit formed using a second portion of conductive material, wherein the first RF circuit and second RF circuit are separated by a gap that does not contain conductive material. The mask structure is formed on at least one of the first RF circuit and the second RF circuits, the mask structure defining at least a first region overlaying at least a first portion of the first RF circuit and at least a first portion of the second RF circuit and overlaying the gap and defining a second region that overlays a second portion of the second RF circuit, wherein the first region is enclosed by a first boundary defined by the mask structure and wherein the second region lies outside of the first boundary. The cover layer is sized to fit within the first region, wherein the cover layer comprises a laminatible insulating material configured to flow within the first region during a lamination process, wherein the first boundary is configured to prevent the laminatible insulating material from flowing into the second region, and wherein the laminatible insulating material is configured to flow to fill at least a portion of the gap during the lamination process.

In some embodiments, the printed circuit board further comprises a conductive surface finish layer formed on the second region of the second RF circuit, wherein the conductive surface finish layer is configured to protect conductive material in the second region of the second RF circuit. In some embodiments, after the lamination process, at least a portion of the laminatible insulating material fills at least a portion of the gap and is configured to minimize arcing between the first RF circuit and the second RF circuit. In some embodiments, the cover layer comprises prepreg material.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims included herein.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which.

The drawings are not to scale, emphasis instead being on illustrating the principles and features of the disclosed embodiments. In addition, in the drawings, like reference numbers indicate like elements.

DETAILED DESCRIPTION

Figure 1:
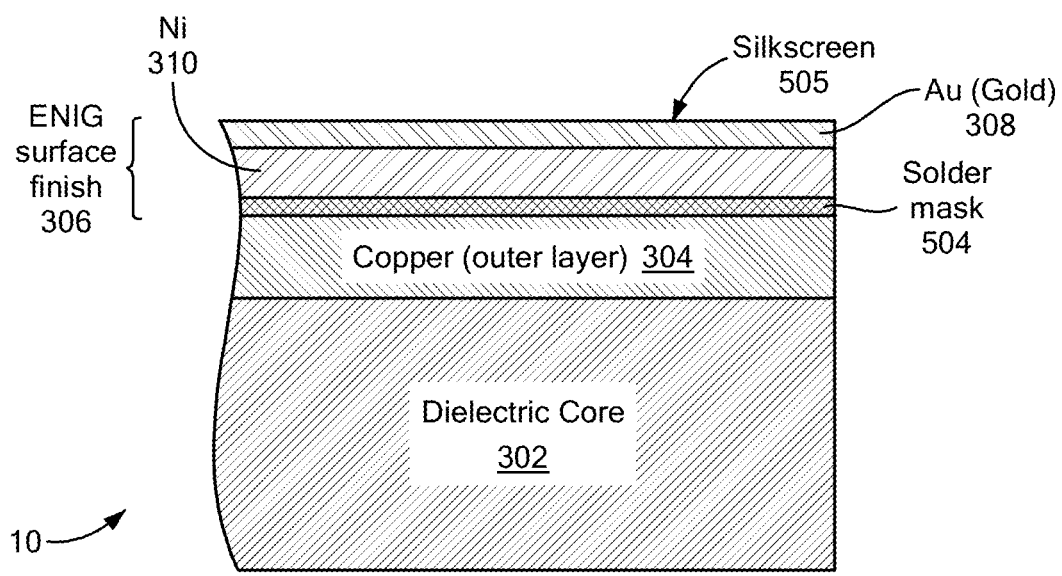
FIG. 1 is a portion of a cross-section of an exemplary prior art first PWB.

Before describing details of the particular systems, devices, and methods, it should be observed that the concepts disclosed herein include but are not limited to a novel structural combination of components and circuits, and not necessarily to the particular detailed configurations thereof. Accordingly, the structure, methods, functions, control and arrangement of components and circuits have, for the most part, been illustrated in the drawings by readily understandable and simplified block representations and schematic diagrams, in order not to obscure the disclosure with structural details which will be readily apparent to those skilled in the art having the benefit of the description herein. In addition, the following detailed description is provided, in at least some examples, using the specific context of antenna elements and related RF circuits, but this is merely exemplary and not limiting. It should be appreciated that such references and examples are made in an effort to promote clarity in the description of the concepts disclosed herein. Such references are not intended as, and should not be construed as, limiting the use or application of the concepts, systems, arrangements, and techniques described herein to use solely with these or any other systems.

In addition, it is noted that various connections are set forth between elements in the following description and in the drawings. These connections in general and, unless specified otherwise, may be direct or indirect, and this specification is not intended to be limiting in this respect. In this disclosure, a coupling between entities may refer to either a direct or an indirect connection. It should be understood that throughout the drawings, corresponding reference numerals indicate like or corresponding parts and features. As used herein, the term module, unit and/or element can be formed as processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Additionally, use of the term "signal" in conjunction with this disclosure is not limited to analog and/or digital signals but rather is meant to denote as well (1) the mathematical description of any measurable phenomena in nature or in human-made systems and (2) the mathematically described function of one or more variable depending on one or more parameters. Examples of types of signals which are encompassed in the embodiments described herein include, but are not limited to, light intensity, voltage, pressure, electromagnetic radiation (including radio waves), magnetic field strength and electric field strength.

Because of the well-known electrical "skin effect," in conductors, conduction of alternating (sinusoidal) signals are largely confined to a region at and near the surface of the conductor. That is, alternating electric current does not flow uniformly with respect to the cross-section of a conductive element, such as a wire. Rather, the current density is highest near the surface of the conductor and decreases exponentially as distance from the surface increases. Generally, the higher the frequency, the shallower the region (and closer to the surface) where current is conducted.

"Skin-Depth" is the depth of the conductor the RF current uses. RF current does not penetrate deeply into an electrical conductor—it flows along the surface; this is known as the "Skin-Effect". In connection with the skin effect, in some embodiments, the "skin depth" refers to the depth within a conductor at which the current density reaches approximately 37% of its value at the surface of the conductor. Different conductors made of different materials can have different skin depths based on frequency and based on the resistivity and relative permeability of the respective material. Thus, a conductor's conductivity (c) plays a role in the determination of skin depth. In addition, combinations of conductors (e.g., layers of conductors, such as those found in some surface finishes) can have an impact on skin depth, both individually and in total. In those instances where there is a combination or layer of connected conductors, such as on a wire made of a first material and having a plating or coating made of a second material, where the first and second (and, optionally third) materials each have a different conductivity, one must consider not only the conductivity of the main or primary conductor (e.g., a copper conductors on a PWB, a copper trace, copper wire, etc.), but also the conductivity of any final plated finish that is operably coupled to and which protects the main conductor.

For example, in some PWBs, a copper conductor may be plated with a layer of surface finish, as discussed previously in connection with the prior art PWBs of FIG. 1A and FIG. 1B. In instances where a plated PWB finish (e.g., a surface finish) is less conductive than copper, there may be a lower composite conductivity and a larger skin depth. For example, for an ENIG finish (Nickel over Gold) over copper, the conductivity is a composite of that of the nickel and gold of the ENIG, and that of the copper conductor. At lower frequencies, all three metal conductors are used for current flow. At higher frequencies, the skin depth decreases and only the nickel-gold portion serves as conductor, with mostly gold as the conductor at very high frequencies. However, if the layer of gold is extremely thin, at very high frequencies the skin depth may still include the nickel.

Skin depth can be computed based on physical properties of the conductor materials as well as frequency. A first equation for calculating skin depth δ is shown in equation (1):

$$\delta = \sqrt{\frac{\rho}{\pi f_0 \mu_r \mu_0}} \quad (1)$$

Where:
δ=skin depth (in meters (m))
ρ=resistivity (in ohm meters ((Ω·m))
$f_0$=signal frequency (in Hertz (Hz))
$\mu_r$=relative permeability
$\mu_0$=permeability of free space=$4\pi \times 10^{-7}$ (in H/m)
A second equation for calculating skin depth &s is in equation (2) below:

$$\delta_s = \frac{1}{\sqrt{\pi f \mu \sigma}} \quad (2)$$

Figure 2A:
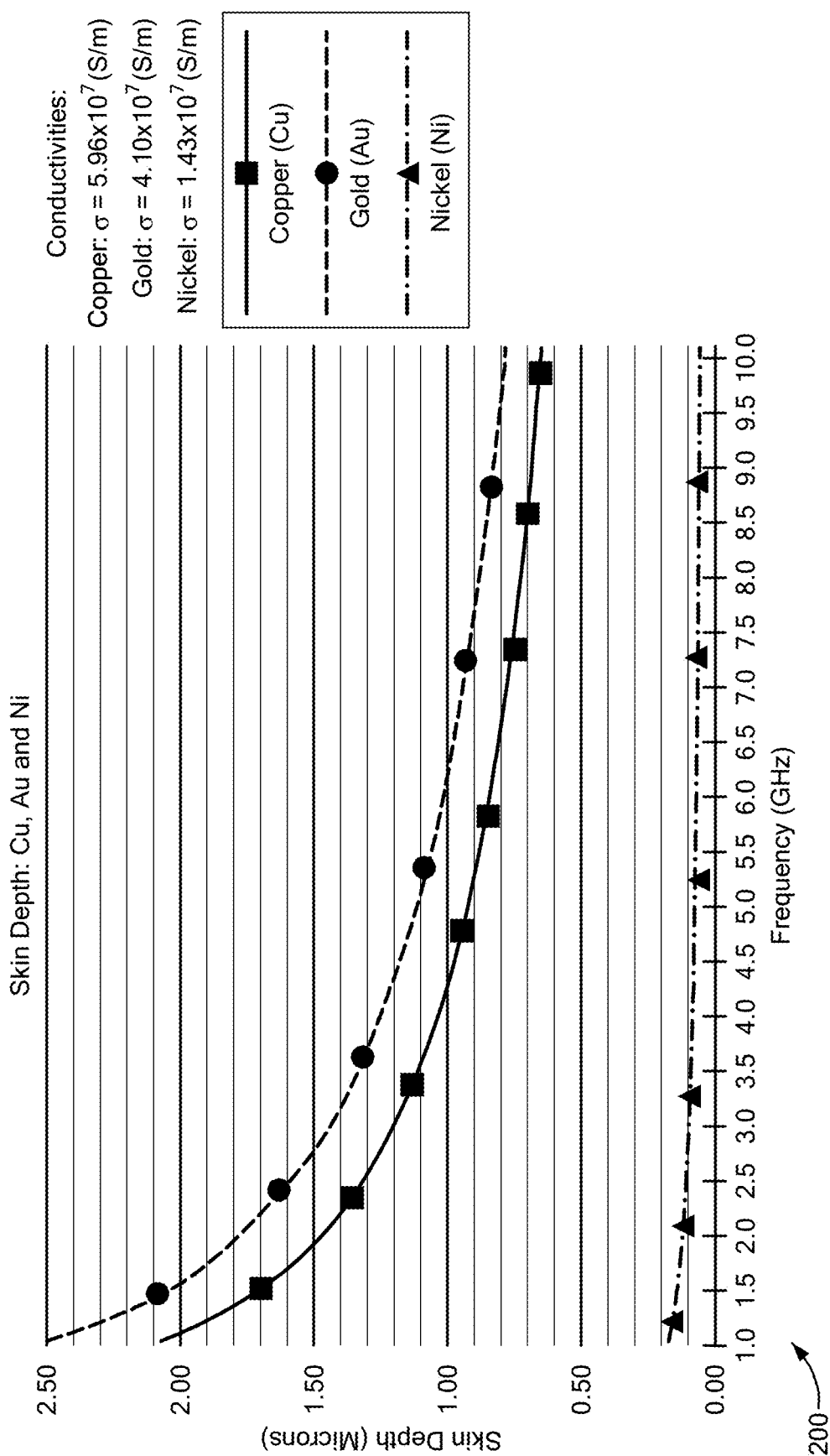
FIG. 2A is a first graph of the skin depth of copper, gold, and nickel, as a function of frequency, from 1-10 GHz, in microns, in accordance with one embodiment.
Figure 2B:
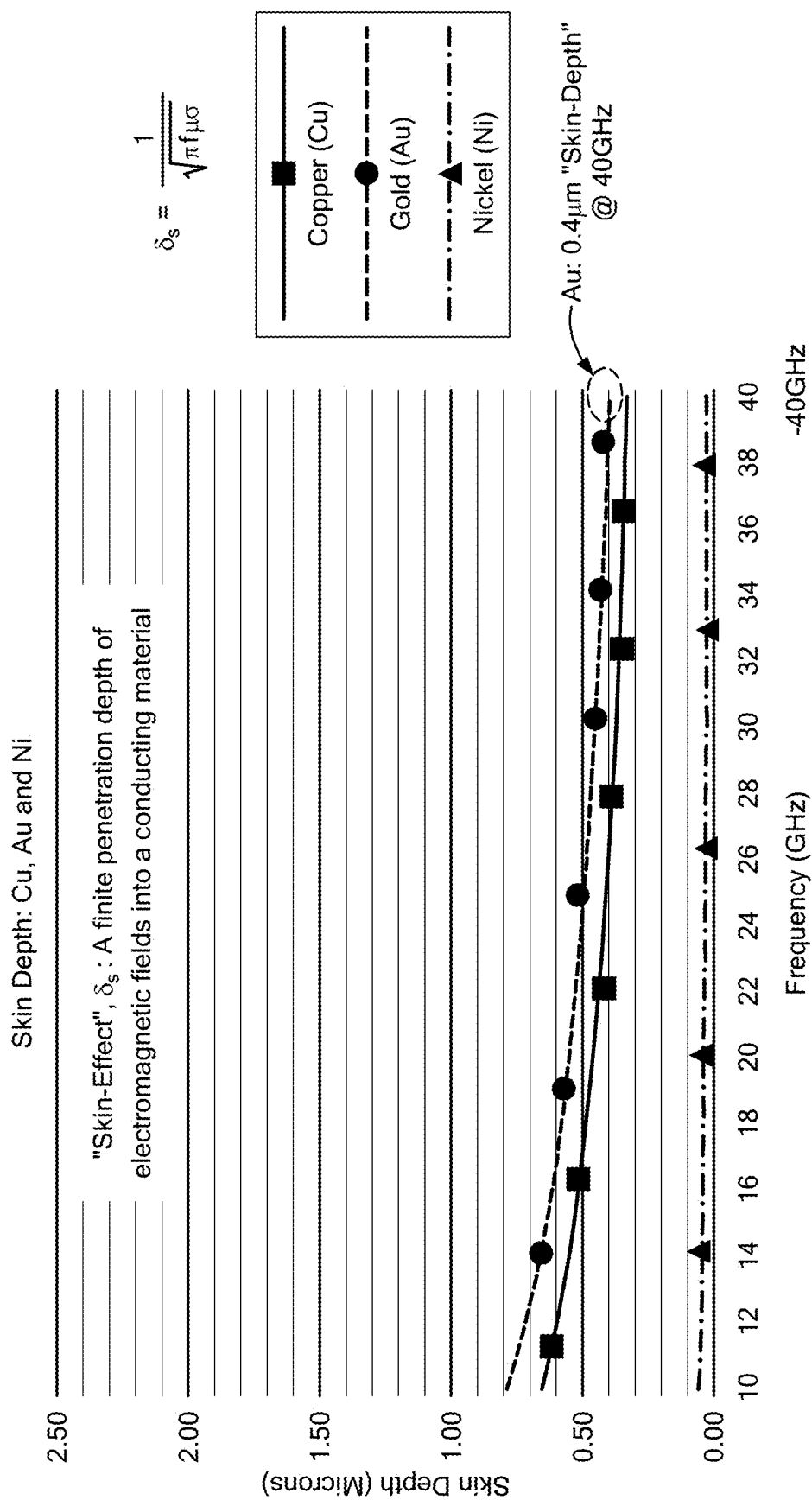
FIG. 2B is a second graph of the skin depth of copper, gold, and nickel, as a function of frequency, from 10-40 GHz, in microns, in accordance with one embodiment.

Where:
$\delta_s$=skin depth (in m)
f=signal frequency (in Hz)
μ=relative permeability
σ=conductivity (in Siemens/m (S/m))
FIG. 2A is a first graph 200 of the skin depth of copper, gold, and nickel, as a function of frequency, from 1-10 GHz, in S/m and FIG. 2B is a second graph 250 of the skin depth of copper, gold, and nickel from 10-40 GHz in microns. As FIG. 2A illustrates, from 1 GHz to 10 GHz the skin depths of copper and gold decrease significantly as frequency increases. Over that same frequency range, the skin depth of nickel decreases, but far less rapidly. As FIG. 2B illustrates, from 10 GHz to 40 GHz, the skin depth of gold and copper continue to decrease measurably, while the skin depth of nickel has a very small rate of decrease.

Figure 3:
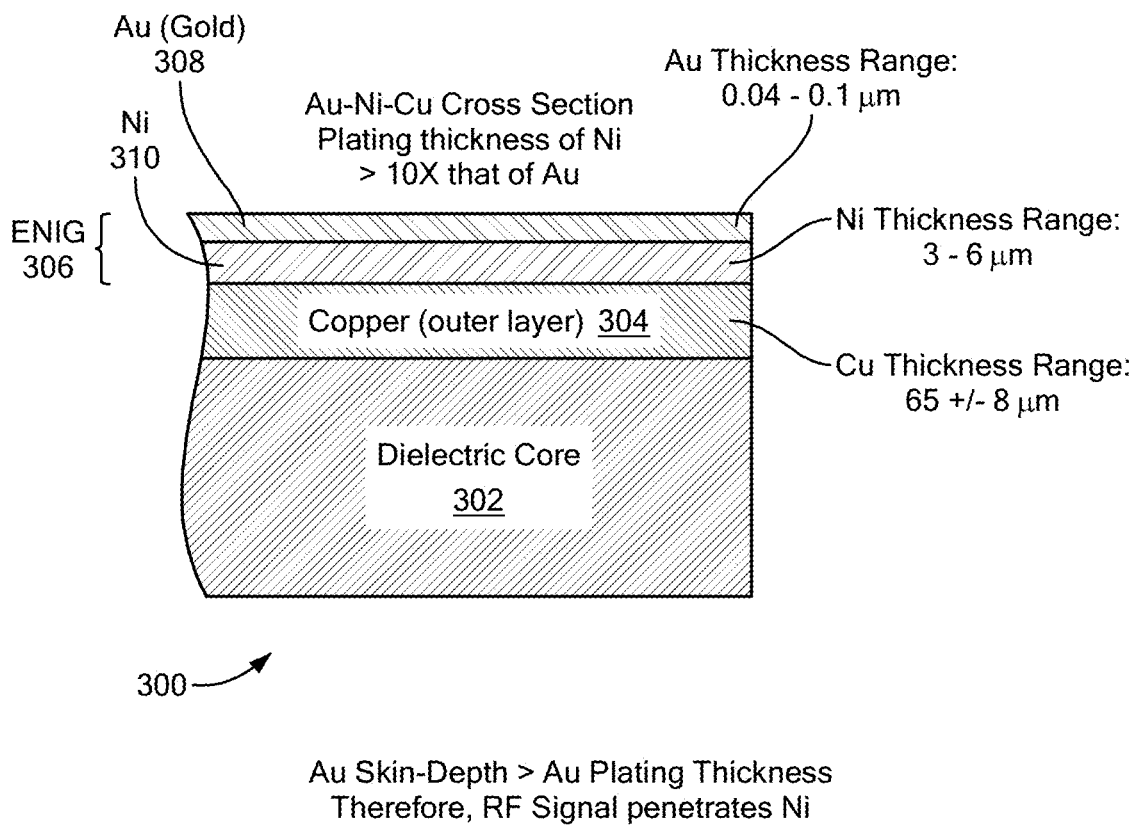
FIG. 3 is a cross-section view of an exemplary PWB, where the PWB has a surface finish of a layer of electroless nickel immersion gold (ENIG), in accordance with one embodiment.

FIG. 3 is cross section view 300 of an exemplary PWB similar to that of FIG. 1A, where the PWB has a surface finish of a layer of ENIG. In the exemplary PWB of FIG. 3, the copper layer 304 has a thickness range of 65+/−8 μm, the nickel layer 310 has a thickness range of 3-6 μm, and the gold layer 308 has a thickness range of 0.04-0.1 μm, which is illustrative of a common type and set of proportions of an ENIG surface finish. As FIG. 3 illustrates, the plating thickness of the nickel is ten times greater than the plating thickness of the gold. When considered in view of the skin depth graphs of FIGS. 2A and 2B, it can be seen that, at certain frequencies, the skin depth of gold layer 308 is greater than the actual plating thickness of the gold layer 308, which means that signals carried in the gold layer, actually would also be carried in layers adjacent to the gold layer, i.e., the nickel layer. Because nickel has significantly more ohmic losses at higher frequencies, this can lead to increased losses, and decreased performance, for high frequency circuits that have surface finishes like ENIG, which utilize very thin layers of gold over nickel. Nickel has a higher ohmic loss due to a lower conductivity and significantly higher permeability.

For example, as FIG. 2B shows, at 40 GHz, the skin depth of gold is approximately 0.4 μm, which is greater than the plating thickness range shown in FIG. 3. Thus, for a circuit implemented using the PWB of FIG. 3, an RF signal carried through such a circuit would penetrate through from the gold layer 308 to the nickel layer 310, as it is being transmitted. Thus, the RF fields associated with these signals penetrate to the nickel layer, and the nickel layer would be helping to conduct/transmit RF signals at higher frequencies, such as 1-40 GHz.

Figure 4:
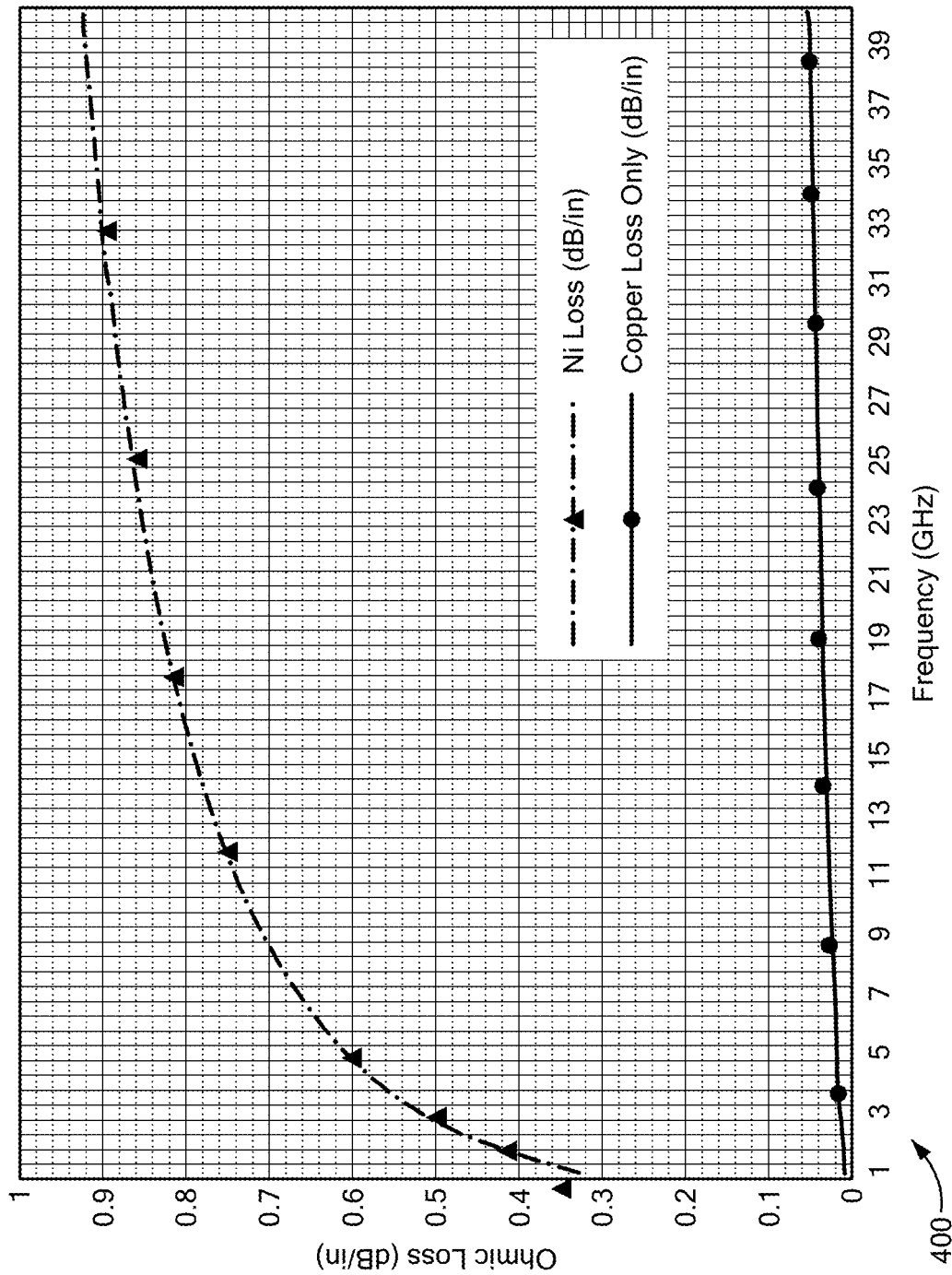
FIG. 4 is an illustrative graph of ohmic loss per inch, for nickel and for copper, in accordance with one embodiment.

However, over the frequency range of 1-40 GHZ, the ohmic loss of nickel is significantly higher than the ohmic loss of a good conductor like copper. Consider FIG. 4, which is an illustrative graph of ohmic loss in decibels (dB) per unit length, in this example, dB/inch (dB/in), for nickel and for copper. As FIG. 4 illustrates, as frequency increases, the ohmic loss of nickel increases considerably, at a much faster rate than the ohmic loss for copper. Nickel, with a relative permeability (μ) of 600, is used in magnetic alloys for permanent magnets. RF fields incident on the nickel layer 310 (FIG. 3) can induce "eddy currents," giving rise to substantial ohmic loss. As is known, nickel is used in magnetic alloys for permanent magnets. For example, "Alnico" is an iron alloy composed primarily of Aluminum (Al), Ni and Cobalt (Co). Several Alnico examples (percent by weight): Alnico V: 14% Ni, 24% Co, 8% Al, 3% Cu; Alnico VIII: 15% Ni, 35% Co, 7% Al, 4% Cu, 5% Ti. An RF field incident on a sheet of Ni induces "eddy currents"-circulating currents. In electrical machinery and transformers, eddy currents can produce significant ohmic loss. The direction of the circulating eddy current is such that the "counter EMF (electromotive force)" produced by the eddy current opposes that of the incident RF field (Lenz' Law). The counter EMF current gives rise to $I^2R$ losses also called "eddy current losses". Hence, even though the skin-depth of Ni is small, due to its high permeability, the RF losses from induced eddy currents is significant. Further contributing to RF loss in Ni is the fact that Ni conductivity of $1.43 \times 10^7$ (S/m) is less than Cu conductivity of $5.96 \times 10^7$ (S/m) and Au conductivity of $4.10 \times 10^7$ (S/m).

Metal surface roughness also has an impact on ohmic loss. As the frequency increases, RF signals run closer to the metal surface and, therefore, experience higher loss due to a longer signal path length.

This problem can be exacerbated in some types of circuits, such as antenna elements. In some types of high frequency circuit applications, an antenna element is part of the PWB outer layer circuit and is also plated with Ni—Au (e.g., ENIG). One example of this type of antenna circuit, which can be plated with ENIG, is a so-called patch radiator antenna element. Antenna patch elements can be used in many different types of systems, such as active electronically scanned array (AESA) systems. However, the aforementioned ohmic losses (due to the nickel in ENIG) can have significant impact on AESA performance. In one example, each additional 0.1 dB of ohmic loss reduces AESA efficiency by 2%. In certain embodiments discussed further herein, a new PWB structure is provided having an RF cover layer that replaces, in some parts of the RF circuit, the ENIG plating, to help provide the environmental protection that the ENIG plating provided, but while eliminating/reducing ohmic losses due to the nickel plating, with no impact on RF performance.

Another issue that can happen with some types of RF circuits that use ENIG on their PWBs, including but not limited to circuits such as notch radiators and printed dipoles, is RF breakdown (also referred to as arcing). Various mechanisms can lead to RF breakdown, and in RF circuits, conditions where a circuit carries high power signals near "electrically small" gaps in a circuit, can lead to RF breakdown, causing irreversible damage to the RF circuit. RF breakdown/arcing can be a significant power-limiting factor in antenna systems. Features that may contribute to RF breakdown include, but are not limited to, the structure geometry, RF frequency, input RF power, pulse width, materials used, surface processing technique and surface electric and magnetic fields, in a given RF circuit. Having electrically small physical gaps between circuit elements (especially those carrying high current/high power) is one type of RF circuit feature geometry that can lead to RF breakdown. In certain embodiments herein, the aforementioned RF cover is configured so that it can help to "fill" at least some of these electrically small physical gaps, with a non-conductive material, to help reduce the probability of an RF breakdown event.

Figure 5A:
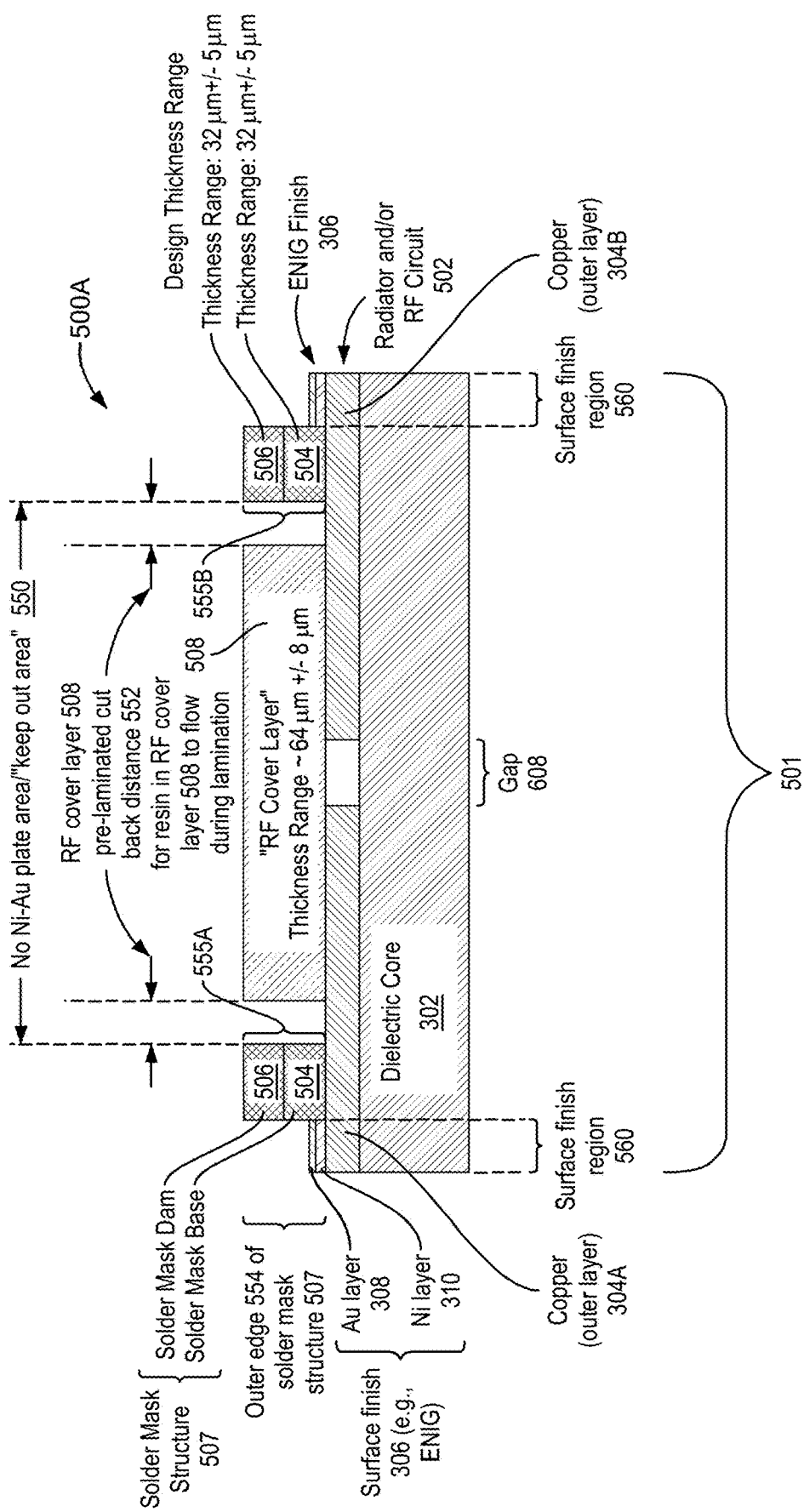
FIG. 5A is a pre-lamination cross-section view of a portion of an exemplary PWB that implements an RF cover layer and modified solder mask structure, in accordance with one embodiment.
Figure 5B:
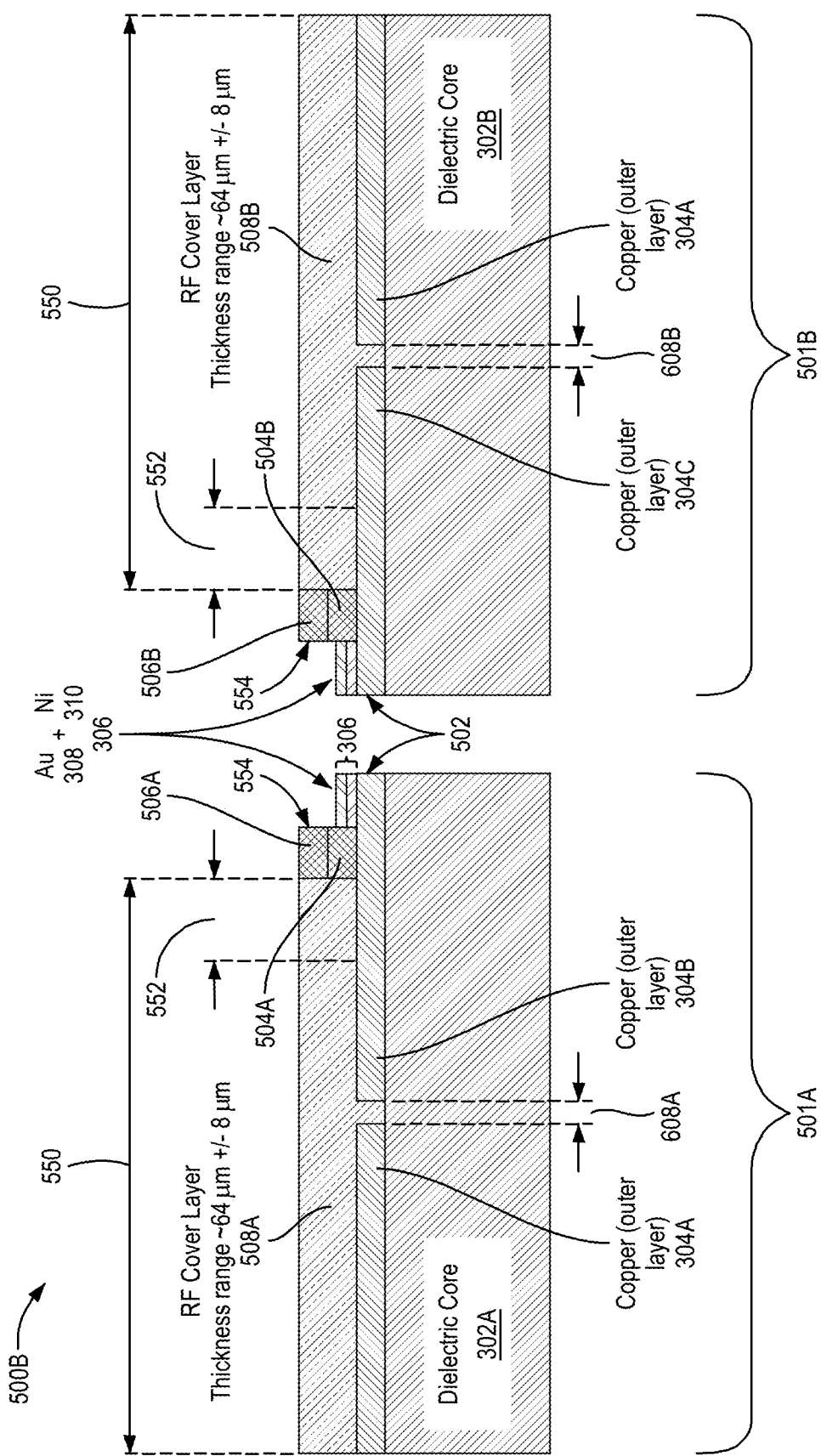
FIG. 5B is a post-lamination cross-section view of a first embodiment of an exemplary PWB that implements and RF cover layer and modified solder mask structure, in accordance with one embodiment.
Figure 5C:
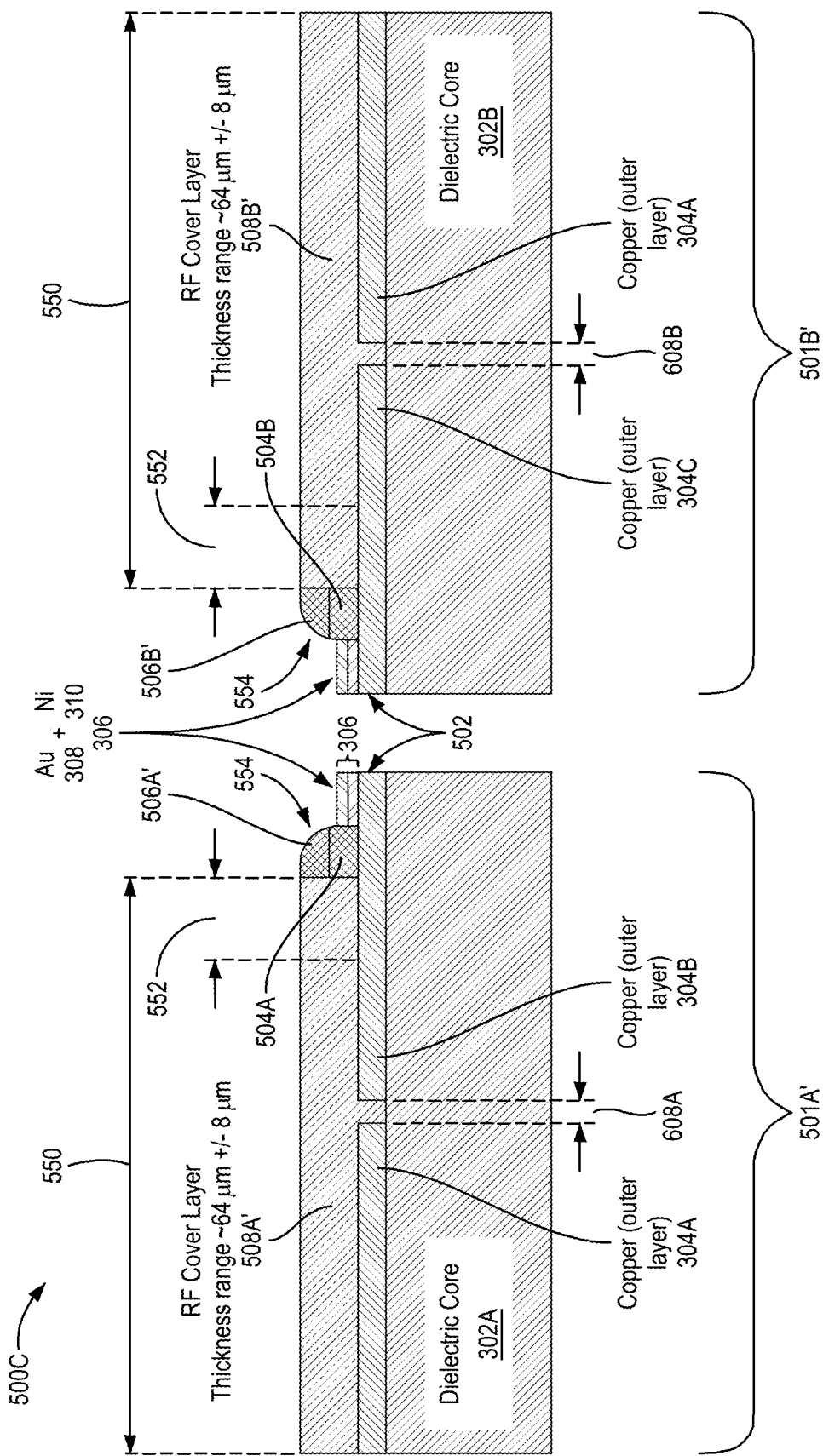
FIG. 5C is a post-lamination cross-section view of a second embodiment of an exemplary PWB that implements and RF cover layer and modified solder mask structure, in accordance with one embodiment.

FIG. 5A is a pre-lamination cross-section view of a portion of an exemplary PWB 500A that implements an RF cover layer 508 and modified solder mask structure 507, in accordance with one embodiment. FIG. 5B is a post-lamination cross-section view of a first embodiment of an exemplary PWB 500B that implements and RF cover layer and modified solder mask structure, in accordance with one embodiment. FIG. 5C is a post-lamination cross-section view of a second embodiment of an exemplary PWB 500C that implements and RF cover layer and modified solder mask structure, in accordance with one embodiment. The embodiment of FIG. 5A shows how portions of the embodiments of FIG. 5B and/or FIG. 5C looks before lamination, before the resin within the RF cover layer 508 has flowed to fill the gap 608 between regions of a conductive layer (e.g., copper layer 304, or other conductive RF circuit layers) and before the resin within the RF cover layer 508 has flowed to the first inner edge 555A and second inner edge 555B of the solder mask structure 507.

Embodiments similar to that shown in any one or more of FIG. 5A, FIG. 5B, and FIG. 5C can be configured to help alleviate at least some of the aforementioned issues relating to RF breakdown and ohmic losses. FIG. 5A shows a portion of an embodiment of exemplary PWB 500A wherein the portion of the copper layer 304A, 304B are associated with a single antenna 501. In contrast, FIG. 5B, which is a post-lamination cross-section, shows a first antenna 501A and a second antenna 501B, separated by a slot 502. Similarly, FIG. 5C, which is also a post-lamination cross-section, shows a first antenna 501A' and a second antenna 501B', separated by a slot 502'. The structures of FIG. 5B and FIG. 5C are similar and differ primarily in the cross-sectional shape of the solder mask dam 506. All of the structures in FIGS. 5A, 5B, and 5C are discussed further herein.

Figure 6:
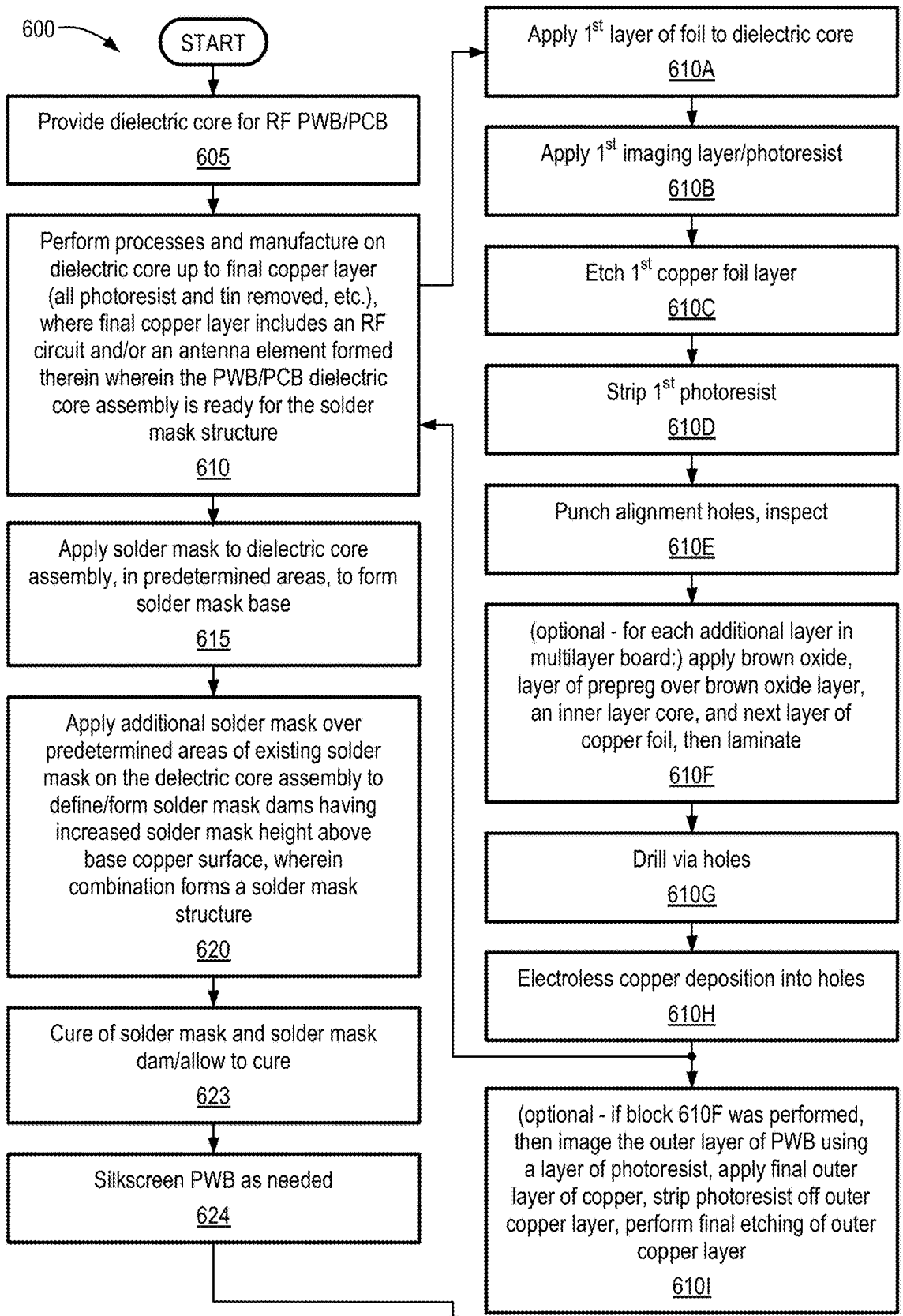
FIG. 6 a flow chart of an exemplary method for making the PWBs of any of FIGS. 5A through 5C, in accordance with one embodiment.
Figure 6:
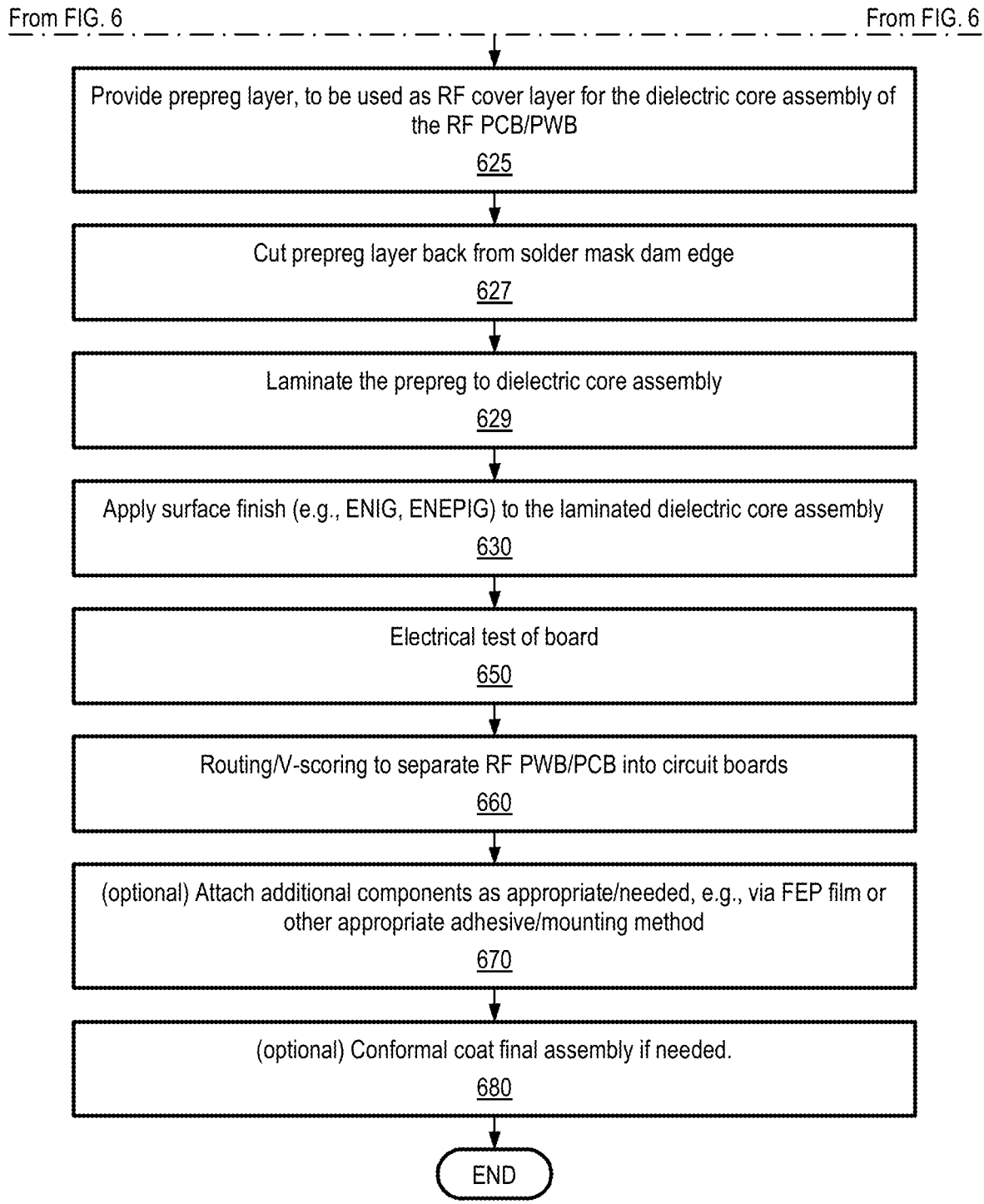

In addition, FIG. 6 is a flowchart 600 of an exemplary method for making the PWB of any of FIG. 5A, FIG. 5B, and or FIG. 5C, in accordance with one embodiment. Referring to FIGS. 5A-5C and FIG. 6, the exemplary PWB 500 includes a dielectric core 302, one or more areas of copper layer 304 (e.g., first area of copper layer 304A and second area of copper layer 304B) as an outer layer (which copper layer 304 already has been etched in accordance with the flowchart 600, as explained further herein), a solder mask structure 507 (made from a solder mask base 504 and a solder mask dam 506), one or more areas of surface finish 306 (made of nickel layer 310 and gold layer 308), and an RF cover layer 508. Each of these elements, including the way they are put together, are discussed further herein. In the exemplary PWB 500 of FIG. 5A, several elements are listed as having a thickness range, but these ranges are illustrative and not limiting.

In addition, as FIGS. 5A-5C illustrate, in certain portions of the PWB 500, at least some portions of the copper layer 304 of each antenna 501 are separated by a gap, which is shown as gap 608 in FIG. 5A, and as first gap 608A and second gap 608B in FIGS. 5B and 5C. That is, a first area of copper layer 304A (e.g., a first portion of conductive material) is separated from second area of copper layer 304B (e.g., a second portion of conductive material), by a gap 608 (or also first gap 608A, second gap 608B). As will be discussed further herein, the RF cover layer 508 is constructed and arranged and cut so that, during lamination, the RF cover layer 508 is configured to fill the gap 608 and is configured to flow up to the first inner edge 555A and second inner edge 555B of a solder mask structure 507 formed by a solder mask base 504 and a solder mask dam 506. In at least some embodiments, the gap filling and flow to the edge takes place during lamination (block 629). Filling this gap 608 helps to alleviate RF breakdown issues, as discussed further herein. In addition, having the RF cover layer 508 flow only up to the inner edge 555 of the solder mask structure helps ensure that, outside of the solder mask structure 507 (e.g., the areas beyond the outer edge 554 of the solder mask structure 507), are free of the cover layer and can be treated, if necessary, with surface finish, or can be soldered to, etc.

Referring to the exemplary PWB 500A of FIG. 5A, the exemplary PWB 500B of FIG. 5B, the exemplary PWB 500C of FIG. 5C, and the flowchart 600 of FIG. 6, a dielectric core 302 is provided (block 605) to provide support for the exemplary PWB 500A/500B/500C (i.e., the dielectric core 302 serves as a support structure). The dielectric core 302, in at least some embodiments, is formed from a non-conductive material selected to be optimal for the type, power requirements, and frequency of circuit with which it is used, to which a copper layer 304 can be laminated. Exemplary materials usable for the dielectric core 302 are well known in the art and include, but are not limited to, materials such as polyamide, FR-4 or other flame-retardant, woven glass-reinforced epoxy resin materials, composite epoxy materials (CEM) (e.g., materials made from a combination of paper, woven glass epoxy, and phenol compounds), filled Polytetrafluoroethylene (PTFE) (random glass or ceramic) composite laminates such as Rogers RT/Duroid and the like, or other suitable material, where the dielectric core 302 can be rigid or flexible, depending on the circuit requirements.

Prior to application of the outer portion of copper layer 304, various manufacturing processes known in the art (block 610) are performed, where the processes of block 610 may include, but are not limited to known PWB manufacturing processes such as:

(a) applying a first layer of copper foil to the dielectric core (block 610A)

(b) applying first imaging layer over first layer of copper foil using a layer of photoresist (block 610B)

(c) etching the first copper foil layer, along the photoresist pattern, to remove unwanted (non-circuit) copper (block 610C)

(d) stripping photoresist off the first copper layer (block 610D)

(e) punch alignment holes and inspect PWB (block 610E)

(f) optional-if it is to be multilayer PWB and/or two-sided PWB, then brown oxide applied to copper layer, then, for each additional layer (block 610F):
  1. apply layer of prepreg over brown oxide layer
  2. apply an inner layer core
  3. apply another layer of copper foil over inner layer core
  4. laminate additional layers together, leaving a final outer layer of copper (g) Drill holes for vias and (optionally) any components with leads and deburring as needed (block 610G)

(h) electroless copper deposition onto holes (block 610H)

(i) (optional), if multilayer PWB and step (f) was performed (block 610I):
  1. image the outer layer of PWB using a layer of photoresist
  2. apply final outer layer of copper (e.g., copper layer 304, if the layer previously applied is not the final outer layer)
  3. strip photoresist off outer copper layer
  4. final etching of outer copper layer 304

In addition, although not shown specifically in the exemplary PWBs 500A/500B/500C of FIGS. 5A-5C, respectively, as a layer, a laminating material, such as prepreg, may be used to laminate the copper layer 304 to the dielectric core 302, as part of the actions in block 610. As is known in the art, prepreg is a fibrous material (e.g., in the form of a fiberglass-like material or a fabric-like material), where the fibrous material is impregnated with a binder material (e.g., resin, such as epoxy-based materials or partially cured polyimides) and then cured into a flexible, semi-solid sheet. The resin of the prepreg corresponds to a laminatible insulating material configured to flow during a lamination process. Prepreg is usable, for example, to laminate core materials to build a PWB stack up. The resin in prepreg is partially cured when in its purchased/provided form. When the prepreg is heated during lamination (and, when optional pressure also is used), the resin flows and encapsulates the planes, traces and pads that are printed on a layer, and fully cures. Once the laminated materials fully cool down, the prepreg solidifies and binds everything together in the resulting structure.

In addition to using prepreg to help laminate materials together, as discussed further herein, in certain embodiments, the RF cover layer 508 also is made of prepreg, which can be advantageous in many applications where prepreg already is used as part of other manufacturing steps for the exemplary PWB 500, because the prepreg will be on hand and already approved for use. Once the processes of block 610 are completed, the resulting dielectric core assembly is ready for application of the solder mask structure 507.

Following the processes of block 610, the solder mask structure 507 is applied to the dielectric core assembly, first by applying the solder mask base 504 to predetermined areas of bare copper 304 on one or more predetermined areas on the dielectric core assembly (block 615), then by applying additional solder to the predetermined areas where the solder mask base 504 was applied, to define and form corresponding solder mask dams 506 having increased solder mask height above the base copper surface (outer portion of copper layer 304) (block 620). As shown in FIG. 5A, FIG. 5B, and FIG. 5C, the solder mask structure 507 is applied to the copper layer 304. Although the flowchart 600 shows the application of the layer of solder mask base 504 (base layer) and the layer of solder mask dam 506 (dam layer) as separate steps, that is not limiting, and those of skill in the art will appreciate that these may be applied together as a single step. It can, however, be advantageous to have two separate steps, because in a given PWB, there may be areas where only solder mask base 504 is applied, and not the solder mask dam 506.

As is known, solder masks are applied to PWB assemblies to help define solderable and non-solderable areas/regions. The material used for the solder mask structure 507 is provided to provide insulation resistance to metallic traces on the exemplary PWB 500A/500B/500C (e.g., copper layer 304) to help distinguish solderable and non-solderable areas, and to help provide environmental protection to non-solderable areas. As is known in the art, various materials are usable as solder mask base 504 material, including but not limited to polymer liquids such as epoxy liquids, liquid photoimageable solder mask (LPSM or LPI) inks and dry-film photoimageable solder mask (DFSM). In the exemplary PWBs 500A/500B/500C of FIGS. 5A/5B/5C, the solder mask base 504 is applied at thickness of approximately 32 µm+/−5 µm, but this is not limiting. Then, on top of selected areas of the solder mask base 504, as part of block 620, an additional portion of solder mask material is added as a solder mask dam 506 on top of the solder mask base 504, to form a solder mask structure 507 on selected areas of the exemplary PWB 500A/500B/500C. In some embodiments, the thickness of the solder mask dam 506 also is 32 µm+/−5 µm, but this is not limiting.

In the embodiment of FIG. 5A, the portion of solder mask dam 506 helps to selectively increase the total solder mask height above the base copper surface (i.e., the surface of copper layer 304). As will be discussed further herein, the resultant solder mask structure 507 that is formed helps to create a barrier to prevent flow of resin in the RF cover layer 508, from flowing over to other selected areas of the exemplary PWB 500A, such as over the surface finish 306. Thus, the solder mask structure 507 defines a region on the copper layer 304 (or other conductive layer) that will have a boundary around it, where the RF cover layer 508 is configured to fill the region defined by the boundary, up to the inner edge 555, and also defines a region on the copper layer 304 that is outside the boundary (i.e., outside outer edge 554), where surface finish 306 is applied.

As shown in FIGS. 5A-5C, the solder mask dam 506 can be implemented in various ways, so long as an inner edge 555 is created on the solder mask structure 507 to help control the flow of the resin in the RF cover layer 508 and so long as an outer edge 554 is created to help define an area outside of which, the surface finish 306 is applied. For example, as shown in FIG. 5A and FIG. 5B, the solder mask dam 506 (FIG. 5A), or solder mask dams 506A, 506B (FIG. 5B) can be substantially aligned to the solder mask base 504. As shown in FIG. 5C, the solder dams 506A', 506B', can be tapered or curved, wherein their base is aligned with the solder mask bases 504A, 504B, respectively, but wherein the outer edges 554A, 554B, that are formed, have a tapered shape. This is not limiting. In some embodiments, a solder mask dam 506 can have a tapered inner edge 555 as well. So long as the resulting solder mask structure 507 has an inner edge 555 configured to stop the flow of resin in the RF cover layer 508 during lamination and an outer edge 554 configured to define an edge beyond which surface finish 306 will not go, virtually any shape of solder mask structure 507 is usable.

In certain embodiments, instead of using solder mask material to build up a solder mask structure 507, other materials could be used to form a structure to control the flow of resin in the RF cover layer 508 (which flow is discussed further herein). For example, in certain embodiments, the outer portion of copper layer 304 instead can be structured to have built up edges that form a similar structure to the solder mask structure 507.

Referring again to FIGS. 5A-5C and 6, after the actions of block 615 and block 620 are performed, the solder mask base 504 and solder mask dam 506 are cured or allowed to cure (block 623). In block 624, the PWB 500A/500B/500C is to apply silkscreen print, as needed, over the surface finish 306 and/or the RF cover layer 508. If necessary, a process is performed (e.g., heat, ultraviolet (UV) light exposure, etc.), as part of block 624, to cure the ink of the silkscreen.

Then, the RF cover layer 508 is applied (blocks 625-629). Note that in FIGS. 5B and 5C, each respective antenna 501A, 501B, 501A', and 501B', has its own corresponding RF cover layer 508A, 508B, 508A', 508B', respectively. However, for simplicity in the explanation, any reference herein to "RF cover layer 508" is intended to refer also to RF cover layers 508A, 508B, 508A', 508B'). A layer of prepreg is provided, to be used as the RF cover layer 508 of the dielectric core assembly (block 625). The prepreg is sized or cut to cover a predetermined area of the PWB, corresponding to the no Ni—Au plate keep out area 550, as shown in FIGS. 5A, 5B, and 5C and is cut back (e.g., by cut back distance 552) (block 627) from the inner edge 555 of the solder mask structure 507, to accommodate prepreg resin flow during lamination (block 629). During the lamination of block 629, the solder mask structure 507 (including the solder mask dam 506) cooperates with the conformal material used during lamination, to help form a seal, a type of "keep out" boundary, that defines a keep out area 550 on the PWB 500A/500B/500C and limits the flow of resin in the prepreg, during lamination, to keep the resin from flowing over selected/predetermined regions of the copper layer 304 (i.e., certain areas of bare copper 304), such as copper layers 304A and 304B as shown in FIGS. 5A-5C that lie outside of the solder mask dam 506, which areas correspond to the surface finish region 560, as shown in FIGS. 5A, 5B, and 5C. This means that the areas of the PWB 500A/500B/500C that are in the keep out area surface finish region 560 will be able to have a surface finish 306 applied in block 630, e.g., a plating of an ENIG surface finish made of a nickel layer 310 topped with a gold layer 308. In addition, during the lamination of block 629, the resin of the prepreg material of the RF cover layer 508 is allowed to flow so as to fill the gap 608 (or also gaps 608A and/or 608B) between the first area of copper layer 304A and the second area of copper layer 304B. This filling of the gap helps to reduce the aforementioned RF breakdown issue, by filling the gap 608/608A/608B with a material having insulating properties (i.e., the resin of the prepreg in the RF cover layer 508), as discussed further herein.

Figure 7:
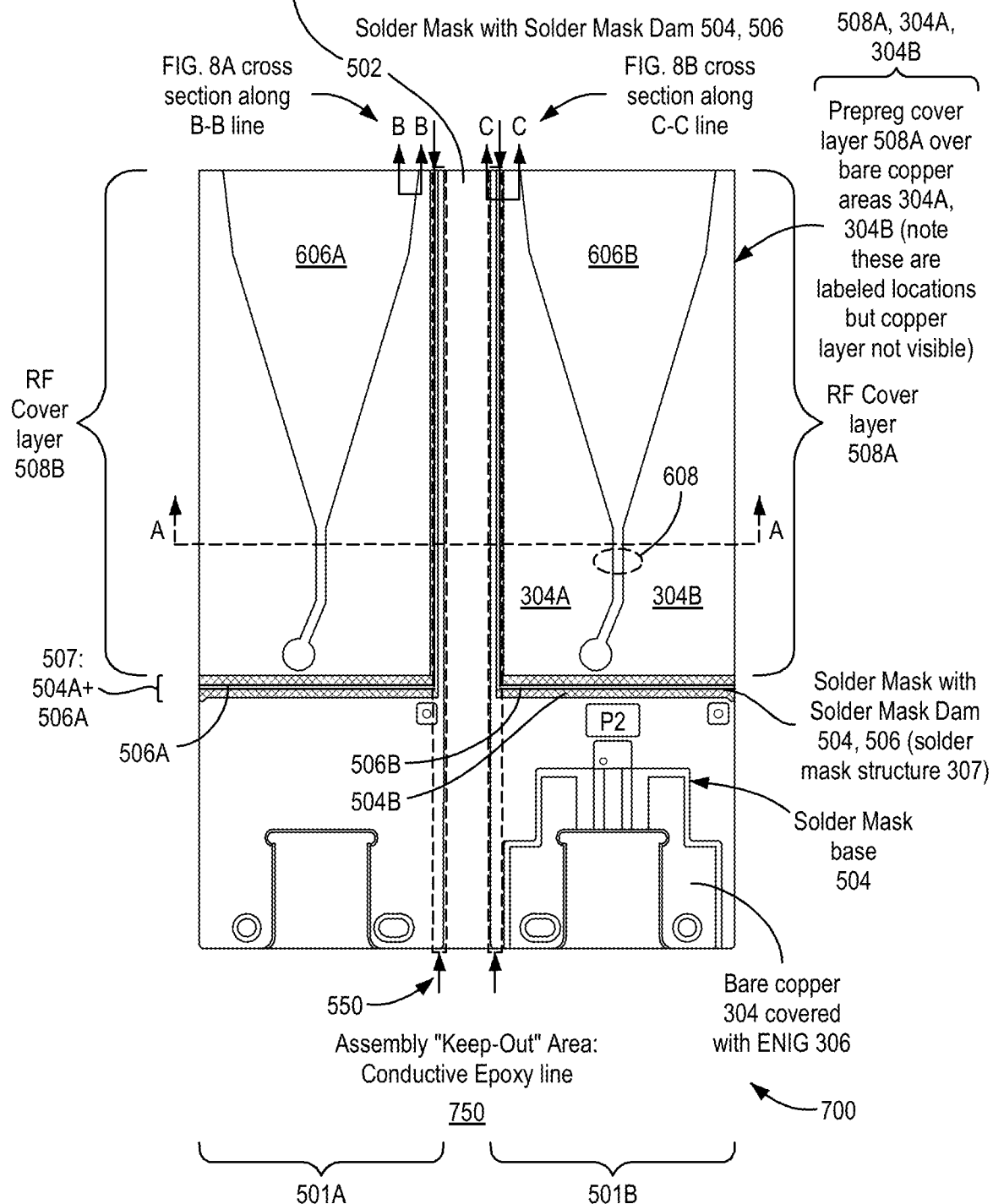
FIG. 7 is an illustrative cross section view of a first application of the exemplary PWB of any of FIGS. 5A-5C, for a fabricated notch radiator PWB, in accordance with one embodiment.

Thus, the RF cover layer 508 is configured to enhance circuit performance (e.g., performance of an antenna, such as the notch radiator discussed further herein in connection with FIG. 7). By improving voltage breakdown performance and by reducing ohmic losses, use of an RF cover layer 508, such as implemented herein, has potential to improve many different types of circuits, especially RF circuits. The RF cover layer 508 is a dual-purpose cover, providing not only the protection from corrosion and other features common to covers, but also the performance improvements that arise from reduced ohmic losses and a higher RF breakdown voltage. The potential improvement in ohmic losses from arrangements that use the RF cover layer 508, in at least some embodiments, can correspond to the full difference between Ni ohmic loss and Cu ohmic loss, as shown in FIG. 4, which can be, for example, up to 0.9 dB/inch (e.g., at around 40 GHZ). This can be very significant in improving efficiency in some applications. For example, in AESA systems, each 0.1 dB ohmic loss reduces AESA efficiency by 2%. An improvement of up to 0.9 dB/in thus can translate to 18% efficiency improvement.

The RF cover layer 508 also is usable, in various embodiments, with other circuit arrangements, such as radomes. For example, antenna arrangements with radomes can have radomes that are designed to minimize most reflections, but, because the RF cover layer 508 typically is just 2 to 5 mils thick, that amount of thickness of dielectric will have little to no impact on performance of an antenna used with a radome, such that reflections would be impacted. That is, such antennas with RF cover layers 508 can have the ohmic loss and voltage breakdown advantages that the RF cover layer provides, where the small thickness of the RF cover layer 508 causes no noticeable impact on performance that would impact the radome since the RF Cover Layer dielectric properties and thickness are modeled as an integral part of the radiator. Many other types of antennas, including but not limited to notch, patch, dipole, loop, etc., also can benefit from use of the RF cover layer 508, as will be appreciated. In addition, as those of skill in the art will appreciate, for lower frequency applications, it is possible to implement an arrangement having a thicker RF cover layer 508.

The RF cover layer 508 has application in many military and commercial markets, as well be appreciated, especially with AESA arrays and any active arrays. The RF cover layer 508 is also applicable to 5G wireless communications, especially MIMO (multiple input/multiple output) arrays. Because many wireless carriers have concerns with prime power usage and cost as a significant cost driver, being able to reduce ohmic losses (e.g., due to Ni—Au plating), using the RF cover layer 508, e.g., by adapting the arrangements shown herein, is an economical way to cut operating costs significantly.

Moreover, the RF cover layer 508 has applicability beyond antennas, to virtually any RF circuit or portion thereof, including even parts that are not actively radiating, including but not limited to microstrips, planar waveguides, CPW (co-planar waveguide circuits), slot transmission lines, slot line circuits, filter circuits, because all such circuits benefit from the reduced ohmic losses and the improved RF breakdown performance that the RF cover layer offers.

Referring again to FIGS. 5A-5C and 6, in block 630, the surface finish 306, e.g., the ENIG plating, is applied. The solder mask structure 507, in combination with the RF cover layer 508, effectively forms a "surface finish mask" defining areas where the surface finish can go (e.g., the surface finish region 560) and areas where the surface finish 306 cannot go (i.e., the keep out area 550). The surface finish 306 protects the copper layer 304 from oxidation and is configured to help prepare the surface of the PWB 500A/500B/500C to have components soldered thereto (if applicable). Note that the cross-section views of the PWB 500A in FIG. 5A. PWB 500B in FIG. 5B, and PWB 500C in FIG. 5C, are each only a partial view and are not drawn to scale. Thus, in certain embodiments, in an actual PWB 500A/500B/500C, the surface finish region 560 may be far larger than is illustrated in any of FIG. 5A, 5B, or 5C, and the RF cover layer 508, in certain embodiments, might be configured so that it only covers certain parts of a resulting RF circuit. For example, the RF circuit may be configured to have the RF cover layer 508 disposed only over certain components (e.g., antenna elements and other components that operate at high frequency) that carry RF signals, and not over other elements of the circuit where concerns about RF breakdown and/or ohmic losses, are less of a concern (e.g., areas where non-RF signals, e.g., DC signals, digital control signals, etc.) are provided.

Although the embodiment of FIG. 5A shows the surface finish 306 to be ENIG, that is not limiting. Because a surface finish 306 is a type of joint material that joins two metallic components (e.g., bare copper and a component), there are multiple ways to implement a surface finish. Various types of surface finishes 306 are used in the art and are selected based on cost, environment, reliability, durability, assembly method, etc. Multiple different surface finishes are used in practice, including but not limited to HASL (Hot Air Solder Leveling), immersion tin, hard gold, immersion gold, immersion silver, OSP (Organic Solderability Preservatives), ENEPIG (Electroless Nickel Electroless Palladium Immersion Gold), as well as the aforementioned ENIG. ENIG and/or ENEPIG can be advantageous options, even if costly, because they result in a flat surface, are corrosion resistant, are lead free, have good durability, and have a long shelf life. However, as noted previously herein, the electroless nickel of the ENIG and ENEPIG surface finishes can result in signal loss (e.g., insertion loss) at RF frequencies and above, which is why the embodiment of FIG. 5 replaces the surface finish 306 with the RF cover layer 508 in at least some selected areas of the PWB 500.

After the surface finish 306 is applied, other PWB manufacturing steps can take place. For example, if applicable, electrical test of the board (block 650) is done, to check for electrical properties such as resistances, capacitances, electrical conductivity, shorts, opens, etc., using known arrangements such as probes, so-called bed of nails, and the like. As a final step before being populated, the PWB 500A/500B/500C is routed or v-scored (cut with a v-groove machine) to separate the PWZB into individual circuit boards (block 660). Optionally, once the boards have been separated, the board may be populated with electrical components (block 670) which may be attached with various methods, such as adhesives (both conductive and non-conductive), FEP (Fluo-rinated Ethylene Propylene) film, or any appropriate mounting method. Optionally, depending on application requirements, the entire assembly may be coated, e.g., with conformal coating or other protective material (block 680).

FIG. 7 is an illustrative cross section view of a first application of the exemplary PWB of any of FIG. 5A, 5B, or 5C, for a fabricated notch radiator PWB 700, in accordance with one embodiment. This view of FIG. 7 is as if one is looking down from the top of any of FIG. 5A, 5B, or 5C, down at the RF cover layer 508 and also seen areas of solder mask base 504 as well as the locations of the bare region of copper layer 304 covered with ENIG surface finish 306 (the actual copper layers 304 are not visible in FIG. 7, but their locations under the RF cover layer 508 are indicated). The example embodiment of FIG. 7 was fabricated in accordance with the cross-section exemplary PWB of 500B of FIG. 5B, in accordance with a method similar to that of FIG. 6. The RF cover layer 508 (e.g., the RF cover layers 508A/508B/508A'/508B' of FIGS. 5A/5B/5C) is implemented in FIG. 7 using a prepreg material. In certain embodiments, an advantageous prepreg material that is usable is MEGTRON-6 prepreg material, such as MEGTRON-6 Prepreg R-5670 (K) having 2-ply 1035 glass cloth, 70% resin content; a Dielectric Constant/permittivity (Dk) of 3.35 or less from 1 GHZ-10 GHZ, and Loss Tangent (Df) ranging from 0.002 to 0.004 from 1 GHz to 10 GHz, respectively, although this is not limiting. As those of skill in the art will appreciate, depending on the application, other types of MEGTRON-6 prepreg are usable, such as other family members of the MEGTRON Prepreg R-5670, R-5770 (K), and/or R-5670 (N) products, each of which is available in a number of cloth styles, dielectric constants, and loss tangents, including cloth having a low real dielectric constant, Dk, as is understood in the art. MEGTRON-6 Prepreg materials are available from Panasonic Corporation of Newark, New Jersey.

MEGTRON-6 prepreg is advantageous in this application because it is designed for high frequency, low transmission loss application. However, use of MEGTRON-6 as the RF cover layer 508 is exemplary and not limiting, and many different prepreg materials are usable as the RF cover layer 508. Other brands and types of prepreg are, of course, usable as well, especially those having similar resin content, Dk, and Df values to the MEGTRON-6 product. Advantageously, the prepreg material that is used for the RF cover layer 508, in certain embodiments (e.g., embodiments that operate at RF or above) has a dielectric constant of approximately 4.0 or less, and advantageously the layer of prepreg is relatively thin (e.g., 64 μm+−8 μm) and has a loss tangent of 0.004 or less, but this is not limiting and these values will vary based on application.

Referring still to FIG. 7, the fabricated notch radiator PWB 700 shows a first antenna circuit dielectric 606A within antenna 501A and a second antenna circuit dielectric 606B within antenna 501B, formed thereon, having a slot 502 that has been routed in between them (where the slot, in this example, is used as part of the next higher assembly). The pair of dashed lines adjacent to slot 502 define the Notch radiator assembly keep out area 550 and is defined by the inner edge of the solder mask structure 507 running up along the inner edge of antenna circuit dielectric 606A and antenna circuit dielectric 606B. In the view of FIG. 7, for clarity, the solder mask dams 506A, 506B are shown as the light colored. L-shaped (and reverse L-shaped) ridges atop the darker respective solder mask bases 504A, 504B, respectively. Although it is difficult to see near the upper portion of FIG. 7 (the portion with cross-section lines B-B and C-C), the areas of solder mask base 504A, 504B also do extend up towards these cross-section lines B-B, C-C, as well, and they extend along where the solder mask dams 506A, 506B extend, because the solder mask bases 504A, 504B necessarily are under the solder mask dams 506A, 506B, to provide support, as will be understood. As can be seen in in FIG. 7, in this embodiment, these solder mask dams 506A, 506B have a cross section smaller than the corresponding solder mask bases 504A, 504B, but are configured as shown in FIGS. 5A-5C, to stop the flow of resin in the RF cover layers 508A, 508B, respectively. The cross section that was shown in FIG. 5B was taken along the A-A line shown in FIG. 7.

In FIG. 7. This conductive epoxy line serves a purpose similar to the solder mask structure 507 (FIG. 5) but is placed along the area between antenna circuit dielectrics 606A, 606B on the fabricated notch radiator PWB 700. The solder mask structure 507 is seen in FIG. 7 as the section labeled "solder mask with solder mask dam 504, 506. As FIG. 7 shows, the area outside of the solder mask structure 307 has both a region of solder mask base 504 over a region of bare copper layer 304 covered with ENIG surface finish 306 (shown in FIG. 7). FIG. 7 includes marked off sections defined by lines B-B and C-C, where line B-B shows the area from which the FIG. 8A cross-section (discussed further below) is taken and where line C-C shows the area from which the FIG. 8B cross section (discussed further below) is taken.

The fabricated notch radiator PWB 700 of FIG. 7 also depicts the narrow gap 608 that exists between the first bare copper region (which is covered with the RF cover layer 508) and the second bare copper region (which is also covered with the RF cover layer 508). For simplicity, only one gap 608 is labeled in FIG. 7, and the locations of two illustrative bare copper layers 304A, 304B are indicated for only one of the antenna circuit subassemblies (antenna circuit dielectric 606B), but FIG. 7 shows that each antenna circuit dielectric 606A, 606B has a respective gap 608 corresponding to an area in between its respective regions of bare copper layer 304 that are under the RF cover layer 508. As is understood, the regions of bare copper layer 304, in some embodiments, correspond to circuit components or elements, such as components that are part of notch radiator antenna circuits, which may be carrying and/or transmitting RF signals, especially high power RF signals. The area of this gap 608 could be subject to RF breakdown issues without use of the RF cover layer 508, especially if the respective regions of bare copper layer 304 are carrying high RF power levels. However, as shown in the exemplary embodiments of FIGS. 5A, 5B, and 5C, the RF cover layer 508 helps to fill that gap with dielectric material, as discussed previously. As will be understood, the dielectric material helps to reduce the chance of any arcing across the gap 608 by providing insulating material that substantially fills the gap 608. Use of an RF cover layer 508 material such as MEGTRON-6, or other comparable materials and/or dielectrics, can help with voltage breakdown strength in many types of gaps between current carrying layers and can eliminate and/or at least reduce arcing that can happen in gaps between current carrying layers or other current carrying elements, by filling these gaps with the RF cover layer material. The following computations and examples can help to understand the breakdown voltage advantages of using prepreg, such as MEGTRON-6, for an RF cover layer 508.

Using the test method of Institute for Printed circuits Test Method 650 TM-650 2.5.6.2 (IPC TM-650 2.5.6.2), MEGTRON-6 has an electrical strength of 1000-1500 v/mil per its data sheet, which is equivalent to 390-590 KV/cm and 39-59 MV/m. Per the same test method, the electrical strength of air, by contrast, is 76 V/mil, 30 KV/cm, and 3 MV/m. It can thus be seen that MEGTRON-6 has ten times the electrical strength of air, so filling a gap 608 between copper layer portions with MEGTRON-6 (as opposed to leaving it to be filled with air) will help to improve the voltage breakdown strength in that area of the circuit.

Assuming an example MEGTRON-6 dielectric has an approximate thickness of 4.5 mils, at a voltage breakdown strength of 1000 V/mil times 4.5 mils, gives a lower bound of voltage breakdown strength of 4.5 KV. In comparison, for the same 4.5 mils of thickness, for air, the voltage breakdown strength at 76 V/mil times 4.5 mils, gives a voltage breakdown strength of just 0.34 KV. It can be seen that MEGTRON-6 significantly increases the voltage breakdown strength in a small gap area. Providing the RF cover layer 508, e.g., as described in at least some embodiments herein, where the resin of the RF cover layer 508 is able to flow into such gaps, reduces the susceptibility to voltage breakdown due to high RF power across electrically small gaps.

Another advantage of improved breakdown strength for RF circuits involves situations such as load mismatch. Having improved voltage breakdown strength also increases the root mean square (RMS) voltage increase due to load mismatch, which also is advantageous.

Case 1: Consider the case of a 50Ω transmission line into a 50Ω load (where Γ=0, VSWR=1), and input power (Pinput)=1 W:

$$P_{input} = \frac{1}{2Z}V^2 \quad (3)$$

$$V = \sqrt{P_{input} * 2 * Z} = \sqrt{1 * 2 * 50} = 10 \text{ V} \quad (4)$$

$$V_{RMS} = \frac{10 \text{ V}}{\sqrt{2}} = 7.07 \text{ V} \quad (5)$$

In Case 1, in accordance with equations (3) through (5), it can be seen that with no load mismatch (i.e., matching loads), VRMS=7.07V Case 2: consider the case of a 50Ω transmission line into a 200Ω load, where there is, thus a load mismatch, and again assume an input power Pinput=1 W:

The maximum voltage in this case can be computed as follows:

$$V_{Max} = V_{RMS} * (1 + \lceil \Gamma \rceil) = 7.07 \text{ V} + (1 + 0.6) = 11.3 \text{ V} \quad (6)$$

where $$|\Gamma| = \frac{200\Omega - 50\Omega}{200\Omega + 50\Omega} = 0.6 \quad (7)$$

$$VSWR = \frac{1+|\Gamma|}{1-|\Gamma|} = \frac{1+0.6}{1-0.6} = 4 \quad (8)$$

Per equations (6) through (8), the maximum RMS voltage increases by 60%, from 7.07V (no mismatch) to 11.3V (mismatch). Thus, with load mismatches, there can be higher RMS voltage, which can increase the chances of RF breakdown. However, when MEGTRON-6 is used instead of air, to fill the gap 608, in the case of a load mismatch, there is a significantly enhanced RMS voltage breakdown strength. Thus, using the RF cover layer 508, as discussed herein, can help improve reliability of RF circuits in mismatch conditions.

Figure 8A:
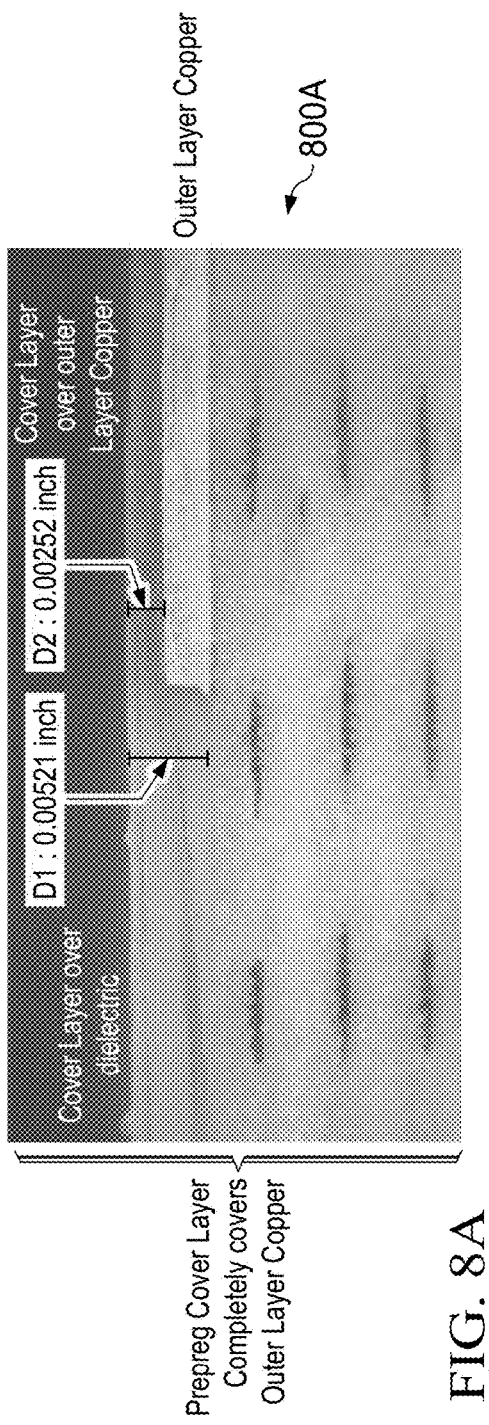
FIG. 8A is an exemplary first cross section sample measurement taken along the B-B line of the illustrative cross section view of FIG. 7, in accordance with one embodiment.
Figure 8B:
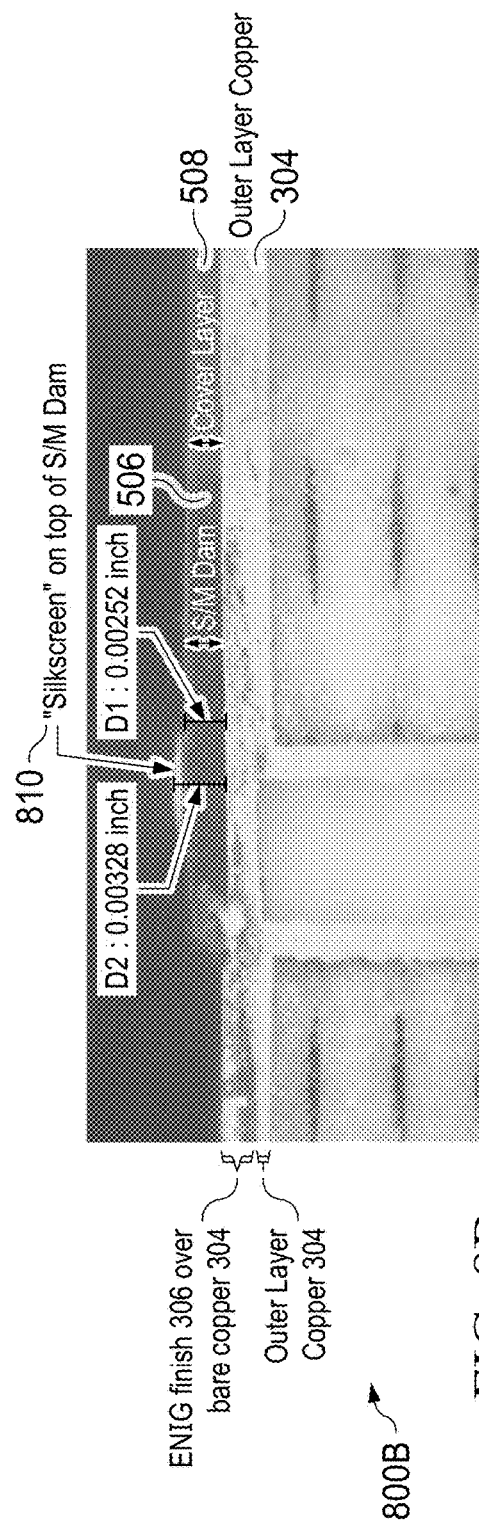
FIG. 8B is an exemplary second cross section sample measurement taken along the C-C line of the illustrative cross section view of FIG. 7, in accordance with one embodiment.

FIG. 8A is an exemplary first cross section sample measurement 800A taken along the B-B line of the illustrative cross section view of FIG. 7, in accordance with one embodiment, and FIG. 8B is an exemplary second cross section sample measurement 800B taken along the C-C line of the illustrative cross section view of FIG. 7, in accordance with one embodiment.

The first cross-section sample measurement 800A is for a fabricated notch radiator PWB 700 of FIG. 7, where there is a MEGTRON-6 cover layer that completely covers the outer portion of copper layer 304. As FIG. 8A shows, the sample measurements show, at the cross section B-B, a total depth of the MEGTRON-6 cover layer 508 (0.00521 inch, which is 5.21 mils or 132.33 μm total thickness) vs the thickness of the portion of RF cover layer 508 covering the outer region of copper layer 304 (i.e., a thickness of 0.00252 inch, or 2.52 mils or 64 μm, which matches the thickness range of the RF cover layer 508 in FIG. 5). The outer layer of copper thus has a thickness of approximately 0.00269 inches. It should be understood that all of these thicknesses shown in FIG. 8A are exemplary and not limiting. FIG. 8A shows the thickness of the PWB as it appears at block 629 in the flowchart of FIG. 6.

The second cross section sample measurement 800B of FIG. 8B shows another portion of the cross section shown in FIG. 7, taken along the C-C line, in an area where the solder mask structure 507 (e.g., the solder mask base 504 and solder mask dam 506) are adjacent to the surface finish 306 (e.g., ENIG finish). FIG. 8B shows, in an exemplary embodiment, how there is a layer of ENIG surface finish 306 over a layer of bare copper layer 304. FIG. 8B also shows a layer of silkscreen 810 on top of the solder mask dam 506. As FIG. 8B shows, the total depth of the solder mask dam, in an exemplary embodiment, is approximately 0.00252 inches, which is approximately the same height as the RF cover layer 508 (which is over the outer region of copper layer 304), as shown in FIG. 8A and also in FIG. 8B. This effectively shows that the solder mask dam 506 has controlled the flow of resin in the prepreg of the solder mask dam 506 and prevented it from flowing outside the solder mask dam 506 (e.g., where the surface finish 306 is located) as specified in FIG. 5. The total thickness of the solder mask dam 506 plus silkscreen 810 is approximately 0.00328 inch, in this embodiment, showing that the thickness of the silkscreen 810 is approximately 0.00076 inches. It should be understood that all of these thicknesses shown in FIG. 8B are exemplary and not limiting. As can be seen, FIG. 8B shows the appearance of the PWB at block 630 in the flowchart of FIG. 6.

Figures 9A, 9B:
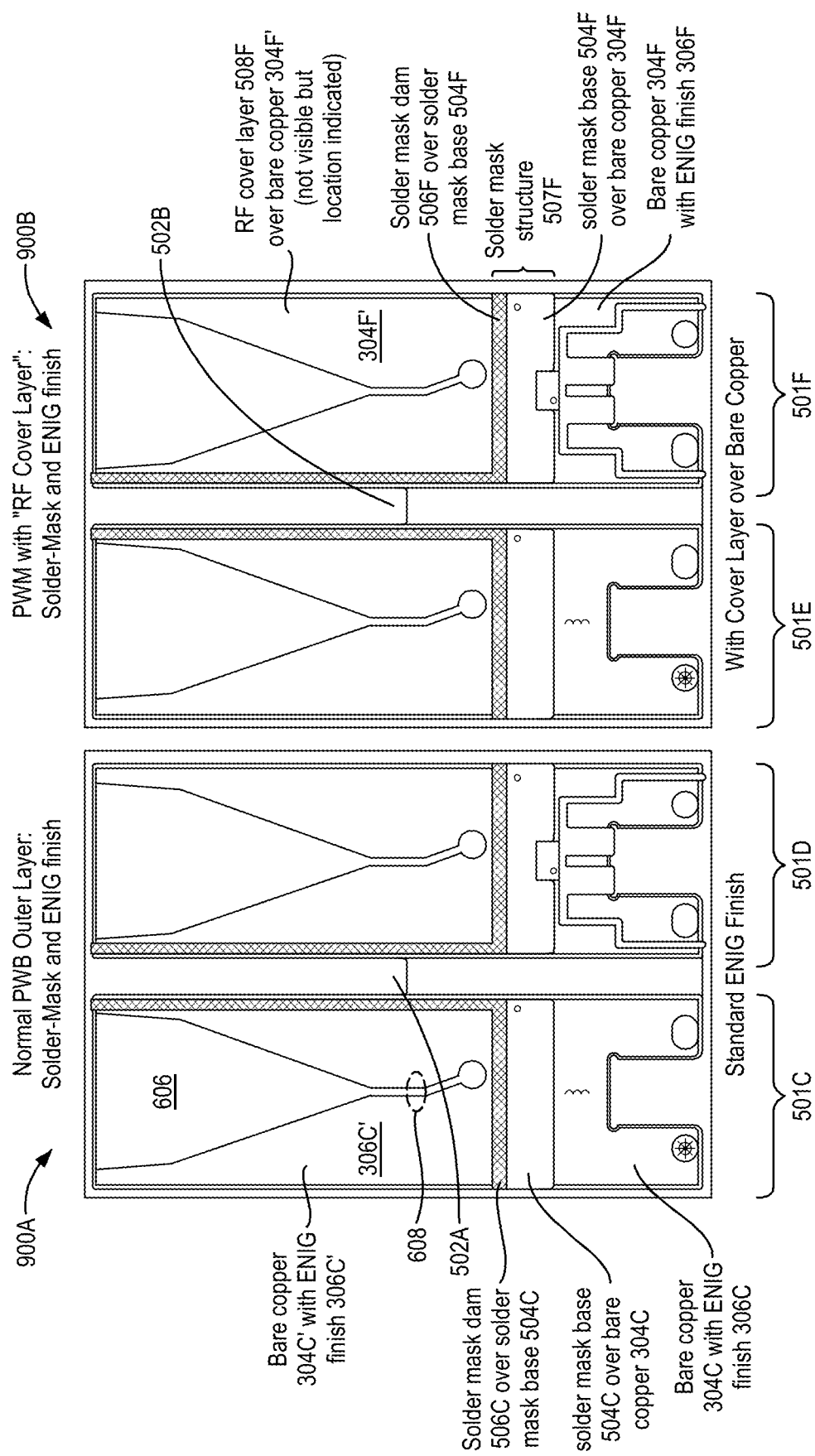
FIG. 9A is an exemplary image of notch radiator outer layer artwork for the fabricated notch radiator of FIG. 7, with a solder-mask and standard ENIG finish as the PWB outer layer, in accordance with one embodiment.
FIG. 9B is an exemplary image of notch radiator outer layer artwork for the fabricated notch radiator of FIG. 7, with an RF cover layer, solder-mask and ENIG finish, as an outer layer, in accordance with one embodiment.

FIG. 9A is an exemplary image 900A of notch radiator outer layer artwork for the fabricated notch radiator of FIG. 7, with a solder-mask and standard ENIG finish as the PWB outer layer, in accordance with one embodiment. The exemplary image 900A is similar to that of FIG. 7A in that it is a top down view of an assembly having antenna assemblies 501C, 501D. For antenna assembly 501C, there is an area of copper layer 304C with ENIG finish 306C, a first region of a solder mask base 504C over copper layer 304C (i.e., bare copper), a solder mask dam 506C over the solder mask base 504C and another area of copper 304C' with ENIG finish 306C'. The antenna assembly 501D is generally similar to antenna assembly 501C although it has a differing pattern of copper layer 304, as will be understood.

FIG. 9B is an exemplary image 900B of notch radiator outer layer artwork for the fabricated notch radiator of FIG. 7, for another pair of antenna assemblies 501E, 501F. with an RF cover layer 508F over copper layer 304 (i.e., bare copper, not visible in FIG. 9B because it is covered with the RF cover layer 508F, but the location of copper layer 304F' is indicated). FIG. 9B also shows a solder mask structure 507F that is made from a solder mask dam 506F formed on a solder mask base 504F. The antenna assembly 501F also includes an area of solder mask base 504F over bare copper 304F, and an area of copper layer 304F with ENIG finish 306F 806A. FIG. 9B is similar to FIG. 9A, except that FIG. 9B has the RF cover layer 508F, whereas FIG. 9A has a standard outer layer and ENIG as a surface finish 306C.

Figure 10A:
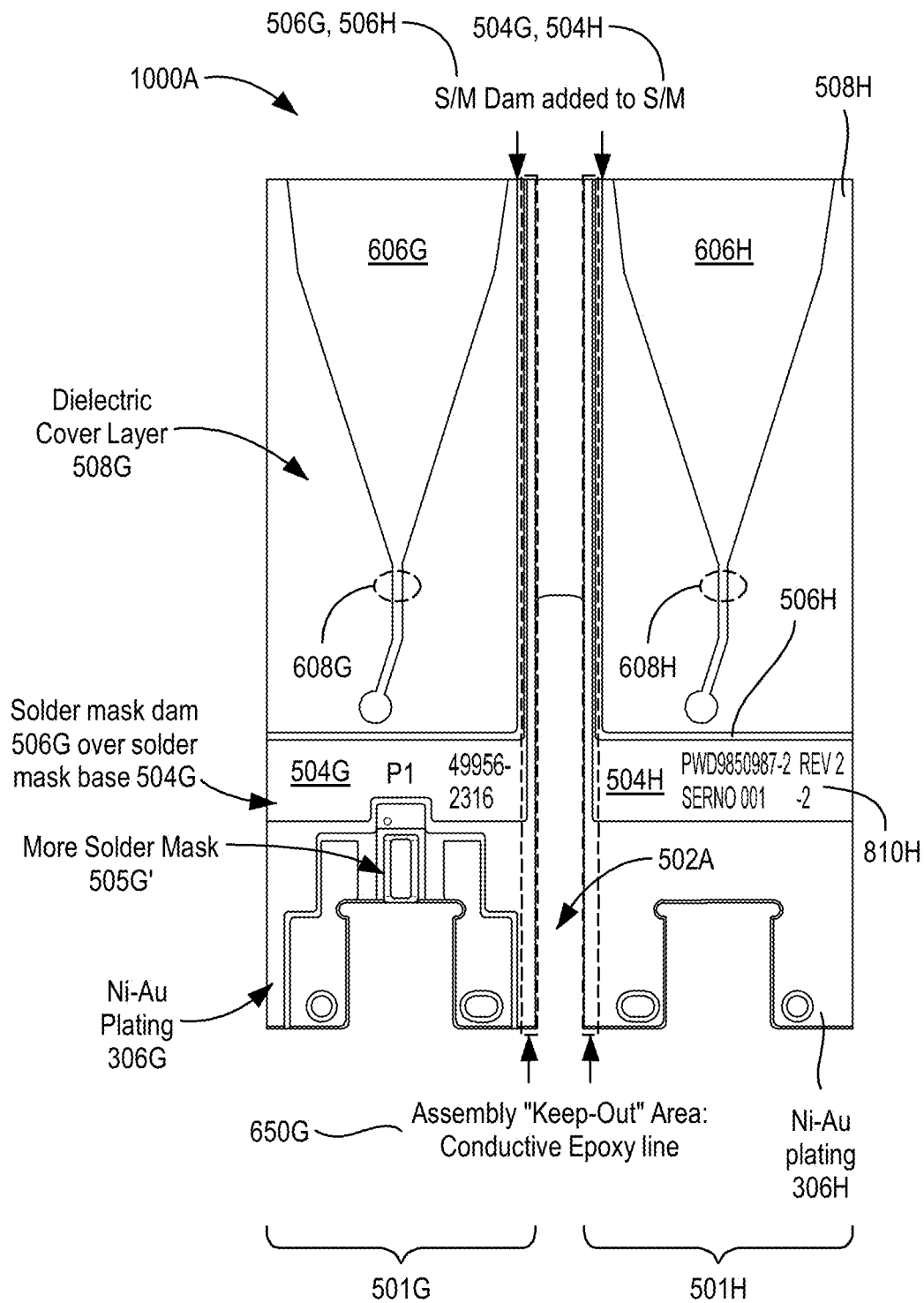
FIG. 10A is an exemplary image of a first fabricated notch radiator PWB with a dielectric cover layer, in accordance with one embodiment.

FIG. 10A is an exemplary image of a first fabricated notch radiator PWB 1000A with a dielectric material serving as RF cover layer 508G, in accordance with one embodiment. The first fabricated notch radiator PWB 1000A includes a first antenna 501G having antenna circuit dielectric 606G and a second antenna 501H having antenna circuit dielectric 606H. The first fabricated notch radiator PWB 1000A implements first and second RF cover layers 508G, 508H, respectively, over the first and second antenna circuit dielectrics 606G, 606H via a dielectric material and has a first routed slot 502A in between a portion of the first antenna 501G and the second antenna 501H. The first fabricated notch radiator PWB 1000A has Ni—Au plating 306G, 306H that is similar to the ENIG finish discussed elsewhere herein. There is a first assembly "keep out" area along a first conductive epoxy line 650G that is along the first routed slot 502A. Similar to FIG. 7, there are areas of solder mask dam 506G, 506H added on top of areas of solder mask base 504G, 504H. Printing made via silkscreen 810H is also visible on the first fabricated notch radiator PWB 1000A. It can be seen that each area of solder mask dam 506G, 506H added to the areas of solder mask base 504G, 504H extends in an "L" shape and reverse "L" shape, around the areas of the respective antenna circuit dielectric 606G, 606H that are covered by the first and second dielectric RF cover layers 508G, 508H. As FIG. 10A illustrates, the first and second RF cover layers 508G, 508H are configured to fill the respective gaps 608G, 608H.

Figure 10B:
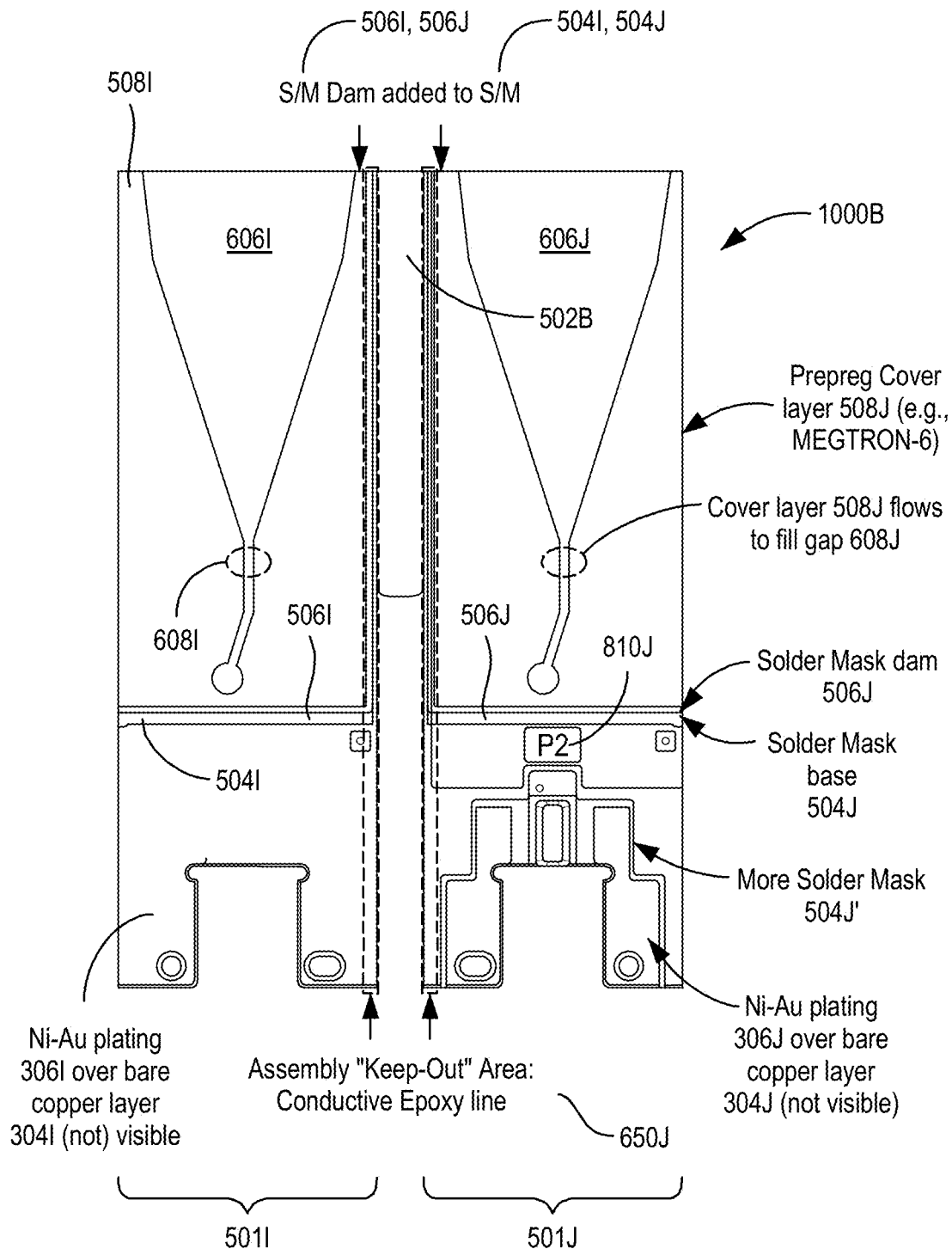
FIG. 10B is an exemplary image of a second fabricated notch radiator PWB with a MEGTRON-6 cover layer, in accordance with one embodiment.

FIG. 10B is another exemplary image of a second fabricated notch radiator PWB 1000B with a prepreg RF cover layers 508I, 508J, in accordance with one embodiment. In this example embodiment, the prepreg that is used is the aforementioned MEGTRON-6, but this is not limiting. The second fabricated notch radiator PWB 1000B of FIG. 10B is similar to the first fabricated notch radiator PWB 1000A of FIG. 10A, except that the RF cover layers 508I, 508J are made from prepreg instead of dielectric. The second fabricated notch radiator PWB 1000B includes a third antenna 501I having antenna circuit dielectric 606I and a fourth antenna 501J having antenna circuit dielectric 606J. The first fabricated notch radiator PWB 1000A implements third and fourth RF cover layers 508I, 508J, respectively, over each respective antenna circuit dielectric 606I, 606J via a prepreg material. Although this embodiment shows both antennas 501I, 501J having RF cover layers 508I, 508J being made from the same material (i.e., prepreg), that is not limiting. It is possible to implement a notch radiator or any other circuit using multiple different cover layer materials.

Similar to the first fabricated notch radiator PWB 1000A of FIG. 10A, the second fabricated notch radiator PWB 1000B of FIG. 10B has a second routed slot 502B in between a portion of the third antenna 501I and the fourth antenna 501J, though it can be seen that the second routed slot 502B is in a different location in the second fabricated notch radiator PWB 1000B as compared to the location of the first routed slot 502A in the first fabricated notch radiator PWB 1000A. The second fabricated notch radiator PWB 1000B has Ni—Au plating 306I, 306J that is similar to the ENIG finish discussed elsewhere herein. There is a first assembly "keep out" area along a second conductive epoxy line 650J that is along the second routed slot 502B. Similar to FIG. 7, there are areas of solder mask dam 506I, 506J added on top of areas of solder mask base 504I, 504J. Printing made via silkscreen 810J also is visible on the second fabricated notch radiator PWB 1000B. It can be seen that each area of solder mask dam 506I, 506J added to solder mask base 504I, 504J extends in an "L" shape and reverse "L" shape, around the areas of the respective antenna circuit dielectrics 606I, 606J that are covered by the respective prepreg cover layers 508I, 508J. As FIG. 10B illustrates, each RF cover layer 508I. 508J flows to fill the respective gaps 608I, 608J, as discussed previously.

Figure 11:
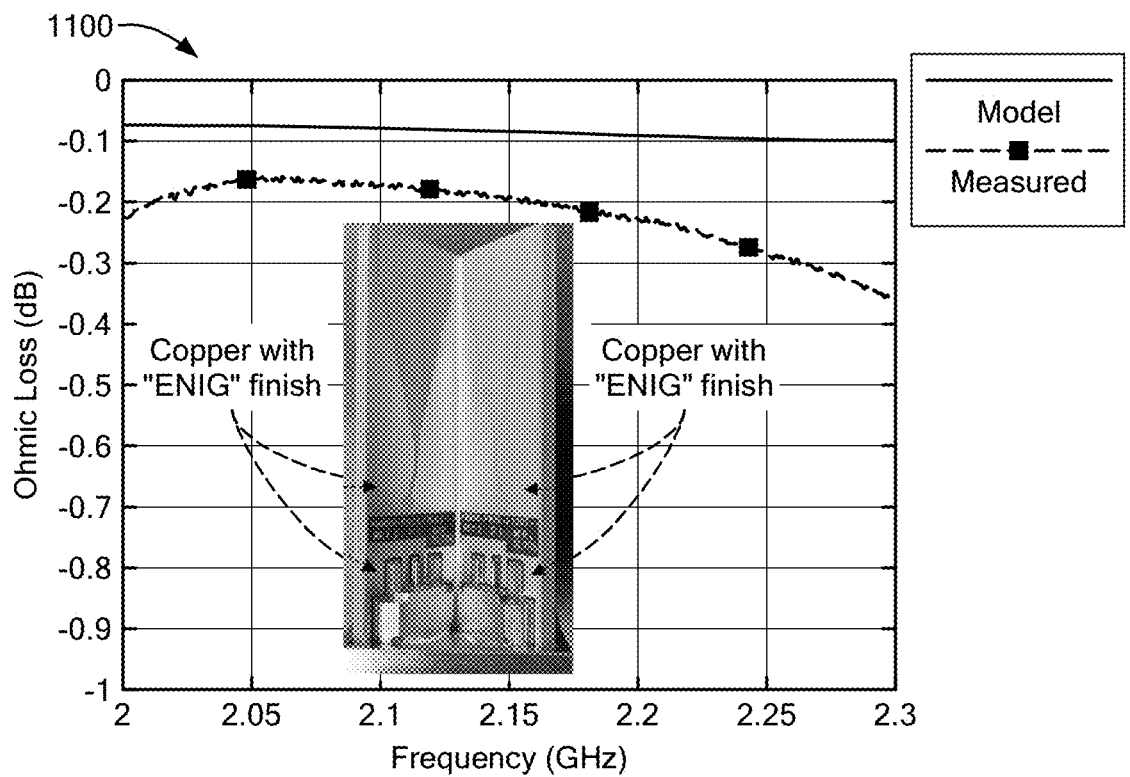
FIG. 11 is an exemplary graph showing ohmic loss in the notch radiator of FIG. 7, without an RF cover layer, in accordance with one embodiment.

As discussed previously herein, using an RF cover layer 508 instead of an ENIG surface finish has potential for significant improvements in performance and efficiency because of the reduction in ohmic losses. FIG. 11 is an exemplary graph showing ohmic loss in dB, as a function of frequency in GHz, for the notch radiator of FIG. 7, without an RF cover layer, in accordance with one embodiment. The graph line for "model" shows what would be expected for the notch radiator without ENIG losses, and the graph line for "measured" shows what was measured for an actual notch radiator circuit, without an RF cover layer 508 (e.g., with a standard ENIG surface finish). As FIG. 11 shows, with increasing frequency, the ohmic losses increase. For example, at 2.2 GHZ, the predicted model for losses expects a loss of about 0.08 dB, but in the actual notch radiator, without an RF cover layer 508, the measured loss was more than double that, at about 0.24 dB. At 2.3 GHZ, it is even worse: the model expects 0.1 dB of ohmic losses, but the measured losses were more than triple that, at about 0.35 dB.

Figure 12:
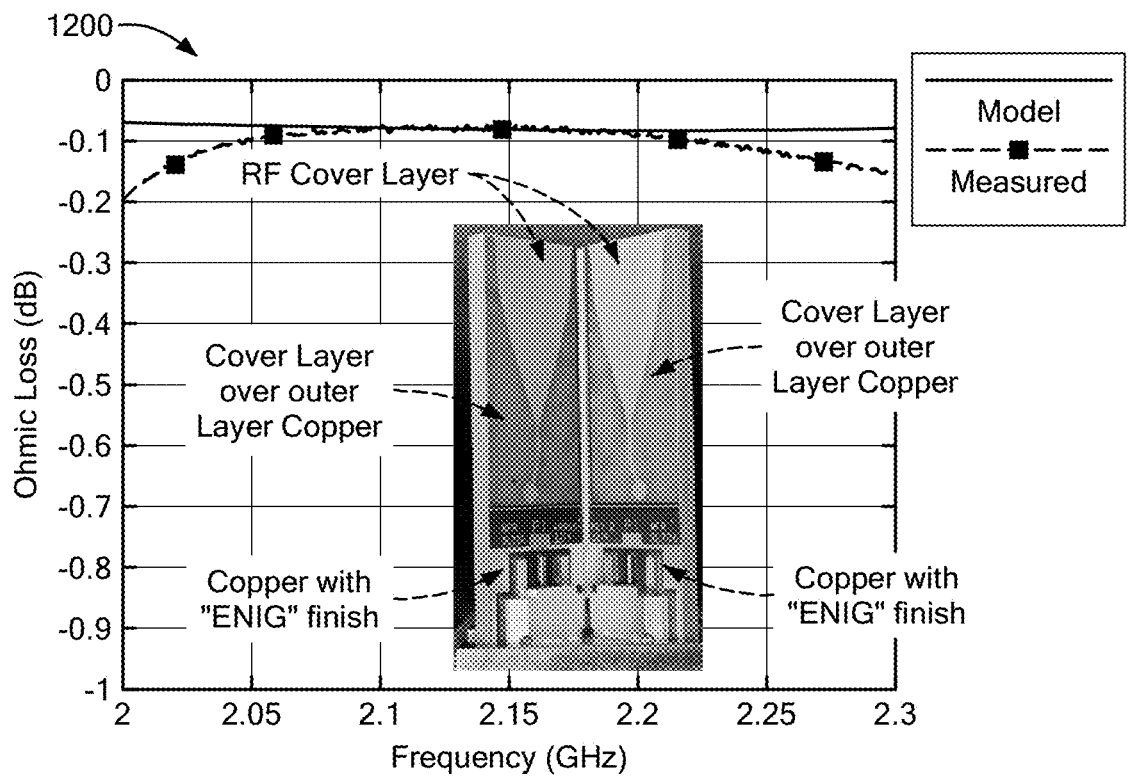
FIG. 12 is an exemplary graph showing ohmic loss in the notch radiator of FIG. 7, with an RF cover layer, in accordance with one embodiment.

FIG. 12 is an exemplary graph 1200 showing ohmic loss in the notch radiator of FIG. 7, with an RF cover layer 508, in accordance with one embodiment, showing ohmic loss in dB as a function of frequency in GHz. As with FIG. 11, the graph line for "model" shows what would be expected for the notch radiator without ENIG losses, and the graph line for "measured" shows what was measured for an actual notch radiator circuit, with an RF cover layer 508, implemented as described herein in connection with FIGS. 5-7. FIG. 12 shows clearly the significant improvements in ohmic losses. From about 2.08 GHz to 2.175 GHz, for example, the measured losses match the model and show an improvement of nearly 0.1 dB. Even more significant improvements are apparent as frequency increases. For example, at 2.25 GHZ, the delta in losses versus the model went from 0.2 dB more loss to about 0.033 dB more loss, an improvement of 30%. At 2.3 GHZ, the delta in losses versus the model went from 0.25 dB more loss to about 0.007 dB more loss, an improvement of 50%.

The disclosed embodiments are not limited to use with the above-listed exemplary systems, modules, and applications. The embodiments described herein have numerous applications and are not limited to the exemplary applications described herein. For example, at least some embodiments herein may be useful for applications in RF and other circuits used in target detection systems (e.g., radar systems) configured to detect, track, monitor, and/or identify targets, where targets can include (but are not limited to) aircraft (both unmanned and manned), unmanned aerial vehicles, unmanned autonomous vehicles, robots, ships, spacecraft, automotive vehicles, and astronomical bodies, or even birds, insects, and rain. At least some embodiments herein are usable with any systems involved with any radar applications, including but not limited to military radars, air traffic control radars, weather monitoring radars, missile defense and surveillance radars, antenna arrays located on cell phone towers (which need to be low cost, reliable, and have low direct current (DC) power consumption), electronic warfare arrays, SATCOM arrays, missile seeker AESA systems, etc. Because of the significant improvements described herein for ohmic losses and RF breakdown, those of skill in the art will appreciate that at least some embodiments herein have applicability in many high frequency applications, including but not limited to AESA applications up to 40 GHz, especially below X band, as well as applications in L. S (and lower) frequency bands. The RF cover layer 508 discussed herein can provide advantages in any active array system or any system where there is a need for higher radiated RF efficiency and/or lower DC prime power consumption, including but not limited to wireless communications of all kinds, satellite systems, any high power microwave systems, and numerous tactical and/or defense applications.

For purposes of illustrating the present embodiments, the disclosed embodiments are described as embodied in a specific configuration and using special logical arrangements, but one skilled in the art will appreciate that the device is not limited to the specific configuration but rather only by the claims included with this specification. In addition, it is expected that during the life of a patent maturing from this application, many relevant technologies will be developed, and the scopes of the corresponding terms are intended to include all such new technologies a priori.

In this disclosure, the terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

Throughout the present disclosure, absent a clear indication to the contrary from the context, it should be understood individual elements as described may be singular or plural in number. For example, the terms "circuit" and "circuitry" and "module" may include either a single component or a plurality of components, which are either active and/or passive and are connected or otherwise coupled together to provide the described function. Within the drawings, like or related elements have like or related alpha, numeric or alphanumeric designators. Further, while the disclosed embodiments have been discussed in the context of implementations using discrete components, including some components that include one or more integrated circuit chips), the functions of any component or circuit may alternatively be implemented using one or more appropriately programmed processors, depending upon the signal frequencies or data rates to be processed and/or the functions being accomplished. Similarly, in addition, in the Figures of this application, the total number of elements or components shown is not intended to be limiting; those skilled in the art can recognize that the number of a particular component or type of element can, in some instances, be selected to accommodate the particular user needs.

In describing and illustrating the embodiments herein, in the text and in the figures, specific terminology (e.g., language, phrases, product brands names, etc.) may be used for the sake of clarity. These names are provided by way of example only and are not limiting. The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. Having described and illustrated at least some of the principles of the technology with reference to specific implementations, it will be recognized that the technology and embodiments described herein can be implemented in many other, different, forms, and in many different environments. The technology and embodiments disclosed herein can be used in combination with other technologies. In addition, all publications and references cited herein are expressly incorporated herein by reference in their entirety. Individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

What is claimed is:

1. A printed circuit board, comprising:
    a support structure;
    a conductive layer operably coupled to the support structure, the conductive layer comprising a first portion of conductive material and a second portion of conductive material separated by a gap that defines a spacing between the first portion of conductive material and the second portion of conductive material, wherein the gap does not contain conductive material;
    a mask structure formed on the conductive layer, the mask structure defining at least a first region on the conductive layer and a second region on the conductive layer, wherein the first region is enclosed by a boundary defined by the mask structure and wherein the second region lies outside of the boundary, wherein the first region includes the gap; and
    a cover layer sized to fit within the first region, wherein the cover layer comprises a laminatible insulating material configured to flow within the first region during a lamination process, wherein the boundary is configured to prevent the laminatible insulating material from flowing into the second region, and wherein the laminatible insulating material is configured to flow to fill at least a portion of the gap during the lamination process.

2. The printed circuit board of claim 1, further comprising a conductive surface finish layer formed on the second region of the conductive layer, wherein the conductive surface finish layer is configured to protect the conductive layer.

3. The printed circuit board of claim 2, wherein the mask structure is configured to serve as a mask during an application of the conductive surface finish layer, wherein the mask structure is configured to limit the application of the conductive surface finish layer to the second region and to prevent application of the conductive surface finish layer in the first region.

4. The printed circuit board of claim 2, wherein the conductive surface finish layer comprises an electroless nickel layer and an immersion gold layer.

5. The printed circuit board of claim 1, wherein the mask structure comprises solder mask material.

6. The printed circuit board of claim 1, wherein the mask structure comprises:
    a base layer formed on the conductive layer; and
    a dam layer formed on the base layer;
    wherein the base layer corresponds to a solder mask applied to the printed circuit board.

7. The printed circuit board of claim 1, wherein the cover layer comprises prepreg material.

8. The printed circuit board of claim 1, wherein the cover layer is sized to ensure that, after the lamination process, the laminatible insulating material is sealed to the mask structure along at least a portion of the boundary.

9. The printed circuit board of claim 1, wherein at least one of the first portion of the conductive layer and the second portion of the conductive layer comprises an element of a radio frequency (RF) circuit.

10. The printed circuit board of claim 1, wherein, after the lamination process, at least a portion of the laminatible insulating material fills at least the portion of the gap and is configured to minimize arcing between the first portion of the conductive layer and the second portion of the conductive layer.

11. The printed circuit board of claim 1, wherein the conductive layer comprises a radiator circuit.

12. A method of making a printed circuit board, comprising:
    providing a support structure;
    applying a conductive layer to the support structure, the conductive layer comprising a first portion of conductive material and a second portion of conductive material separated by a gap that defines a spacing between the first portion of conductive material and the second portion of conductive material, wherein the gap does not contain conductive material;
    forming a mask structure on the conductive layer, the mask structure defining at least a first region on the conductive layer and a second region on the conductive layer, wherein the first region is enclosed by a boundary defined by the mask structure and wherein the second region lies outside of the boundary, wherein the first region includes the gap;
    coupling a cover layer sized to fit within the first region to the first region, wherein the cover layer comprises a laminatible insulating material configured to flow within the first region during a lamination process, wherein the boundary is configured to prevent the laminatible insulating material from flowing into the second region, and wherein the laminatible insulating material is configured to flow to fill at least a portion of the gap during the lamination process, wherein a combination of the support structure, conductive layer, mask structure, and cover layer define a printed circuit board assembly; and
    laminating the printed circuit board assembly.

13. The method of claim 12, further comprising:
applying a conductive surface finish layer to the second region of the conductive layer, wherein the conductive surface finish layer is configured to protect the conductive layer.

14. The method of claim 13, wherein the mask structure is configured to serve as a mask during the applying of the conductive surface finish layer, wherein the mask structure is configured to limit the applying of the conductive surface finish layer to the second region and to prevent applying of the conductive surface finish layer in the first region.

15. The method of claim 12, wherein the laminating is configured to ensure that the laminatible insulating material is sealed to the mask structure along at least a portion of the boundary.

16. The method of claim 12, wherein the laminating is configured to ensure that at least a portion of the laminatible insulating material fills at least the portion of the gap and is configured to minimize arcing between the first portion of the conductive layer and the second portion of the conductive layer.

17. A printed circuit board, comprising:
a support structure;
a conductive RF circuit layer operably coupled to the support structure, the conductive RF circuit layer comprising a first RF circuit formed using a first portion of conductive material and a second RF circuit formed using a second portion of conductive material, wherein the first RF circuit and the second RF circuit are separated by a gap that does not contain conductive material;
a mask structure formed on at least one of the first RF circuit and the second RF circuit, the mask structure defining at least a first region overlaying at least a portion of the first RF circuit and at least a first portion of the second RF circuit and overlaying the gap and defining a second region that overlays a second portion of the second RF circuit, wherein the first region is enclosed by a boundary defined by the mask structure and wherein the second region lies outside of the boundary; and
a cover layer sized to fit within the first region, wherein the cover layer comprises a laminatible insulating material configured to flow within the first region during a lamination process, wherein the boundary is configured to prevent the laminatible insulating material from flowing into the second region, and wherein the laminatible insulating material is configured to flow to fill at least a portion of the gap during the lamination process.

18. The printed circuit board of claim 17, further comprising a conductive surface finish layer formed on the second region of the second RF circuit, wherein the conductive surface finish layer is configured to protect the conductive material in the second RF circuit.

19. The printed circuit board of claim 17, wherein, after the lamination process, at least a portion of the laminatible insulating material fills at least the portion of the gap and is configured to minimize arcing between the first RF circuit and the second RF circuit.

20. The printed circuit board of claim 17, wherein the cover layer comprises prepreg material.

\* \* \* \* \*